(«12») United States Patent
Hayashi et al.

(10) Patent No.: US 12,032,294 B2
(45) Date of Patent: Jul. 9, 2024

(54) ABNORMALITY DETECTION DEVICE OF CHEMICAL SOLUTION, LIQUID PROCESSING DEVICE, SUBSTRATE PROCESSING APPARATUS, ABNORMALITY DETECTION METHOD OF CHEMICAL SOLUTION, LIQUID PROCESSING METHOD, AND SUBSTRATE PROCESSING METHOD

(71) Applicant: Tokyo Electron Limited, Tokyo (JP)

(72) Inventors: Masato Hayashi, Koshi (JP); Takuya Mori, Tokyo (JP); Hideo Shite, Koshi (JP); Hirokazu Sakamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 411 days.

(21) Appl. No.: 17/048,214

(22) PCT Filed: Apr. 1, 2019

(86) PCT No.: PCT/JP2019/014495
§ 371 (c)(1),
(2) Date: Oct. 16, 2020

(87) PCT Pub. No.: WO2019/202962
PCT Pub. Date: Oct. 24, 2019

(65) Prior Publication Data
US 2021/0157237 A1    May 27, 2021

(30) Foreign Application Priority Data

Apr. 18, 2018 (JP) .................................. 2018-080209
Sep. 10, 2018 (JP) .................................. 2018-169007

(51) Int. Cl.
*G03F 7/16*    (2006.01)
*B05C 9/14*    (2006.01)
(Continued)

(52) U.S. Cl.
CPC ................ *G03F 7/162* (2013.01); *B05C 9/14* (2013.01); *B05C 11/08* (2013.01); *G03F 7/168* (2013.01);
(Continued)

(58) Field of Classification Search
None
See application file for complete search history.

(56) References Cited

U.S. PATENT DOCUMENTS 5,730,937 A * 3/1998 Pardikes ................. G01N 33/04
                                                              422/111
2008/0286441 A1* 11/2008 Chang ..................... G03F 7/162
                                                              118/712
2018/0196366 A1*  7/2018 Watanabe ............. G03G 9/0821

FOREIGN PATENT DOCUMENTS

JP    S62-285042 A    12/1987
JP    2001-340800 A   12/2001
(Continued)

OTHER PUBLICATIONS

International Search Report for PCT/JP2019/014495 dated May 21, 2019.

*Primary Examiner* — James M Mellott
(74) *Attorney, Agent, or Firm* — Pearne & Gordon LLP

(57) ABSTRACT

A device includes a chemical solution flow path in which a chemical solution containing polymers flows; a laser beam irradiator configured to irradiate a laser beam to the chemical solution flow path such that an optical path is intersected with a flow direction of the chemical solution in the chemical solution flow path; a light receiving element provided in the optical path passing through the chemical solution flow path; a detector configured to detect, based on a signal output from the light receiving element, an abnormality in a state of polymers corresponding to a majority of the polymers contained in the chemical solution or configured to
(Continued)

detect a ratio between a chemical solution containing the polymers and another chemical solution in the chemical solution flow path.

16 Claims, 16 Drawing Sheets

(51) Int. Cl.
*B05C 11/08* (2006.01)
*H01L 21/027* (2006.01)
*H01L 21/66* (2006.01)
(52) U.S. Cl.
CPC .......... *H01L 21/0273* (2013.01); *H01L 22/20* (2013.01)

(56) References Cited

FOREIGN PATENT DOCUMENTS

| | | |
|---|---|---|
| JP | 2003-100615 A | 4/2003 |
| JP | 2008-066520 A | 3/2008 |
| JP | 2016-225574 A | 12/2016 |
| WO | 2017/126360 A1 | 7/2017 |

\* cited by examiner

ABNORMALITY DETECTION DEVICE OF CHEMICAL SOLUTION, LIQUID PROCESSING DEVICE, SUBSTRATE PROCESSING APPARATUS, ABNORMALITY DETECTION METHOD OF CHEMICAL SOLUTION, LIQUID PROCESSING METHOD, AND SUBSTRATE PROCESSING METHOD

CROSS-REFERENCE TO RELATED APPLICATION

This Application is a U.S. national phase application under 35 U.S.C. § 371 of PCT Application No. PCT/JP2019/014495 filed on Apr. 1, 2019, which claims the benefit of Japanese Patent Application Nos. 2018-080209 and 2018-169007 filed on Apr. 18, 2018 and Sep. 10, 2018, respectively, the entire disclosures of which are incorporated herein by reference.

TECHNICAL FIELD

The various aspects and embodiments described herein pertain generally to a technology of detecting an abnormality of a chemical solution configured to process a target object by being supplied to the target object.

BACKGROUND

In a manufacturing process of a semiconductor device, various films such as a resist film, a base film of the resist film and a film (intermediate layer) provided between the base film and the resist film are formed. The resist film is formed by supplying a resist as a chemical solution to a wafer as a substrate, and the base film and the intermediate layer may also be formed by supplying chemical solutions. Each chemical solution contains a polymer of a predetermined concentration as a main component. Also, the chemical solution may contain a foreign matter that is not originally included. There have been known methods of optically detecting such a foreign matter. For example, Patent Documents 1 and 2 disclose the methods. By the way, the resist film is exposed and developed to have a pattern. However, the pattern may have defects called a bridge and a half bridge in which the resist remains at a position where the resist needs to be removed.

PRIOR ART DOCUMENT

Patent Document 1: Japanese Patent Laid-open Publication No. S62-285042
Patent Document 2: International Publication No. WO 2017/126360

SUMMARY

An abnormality detection device of a chemical solution includes a chemical solution flow path in which a chemical solution containing polymers flows; a laser beam irradiator configured to irradiate a laser beam to the chemical solution flow path such that an optical path is intersected with a flow direction of the chemical solution in the chemical solution flow path; a light receiving element provided in the optical path passing through the chemical solution flow path; a detector configured to detect, based on a signal output from the light receiving element, an abnormality in a state of polymers corresponding to a majority of the polymers contained in the chemical solution or configured to detect a ratio between a chemical solution containing the polymers and another chemical solution in the chemical solution flow path.

DETAILED DESCRIPTION

Figure 1:
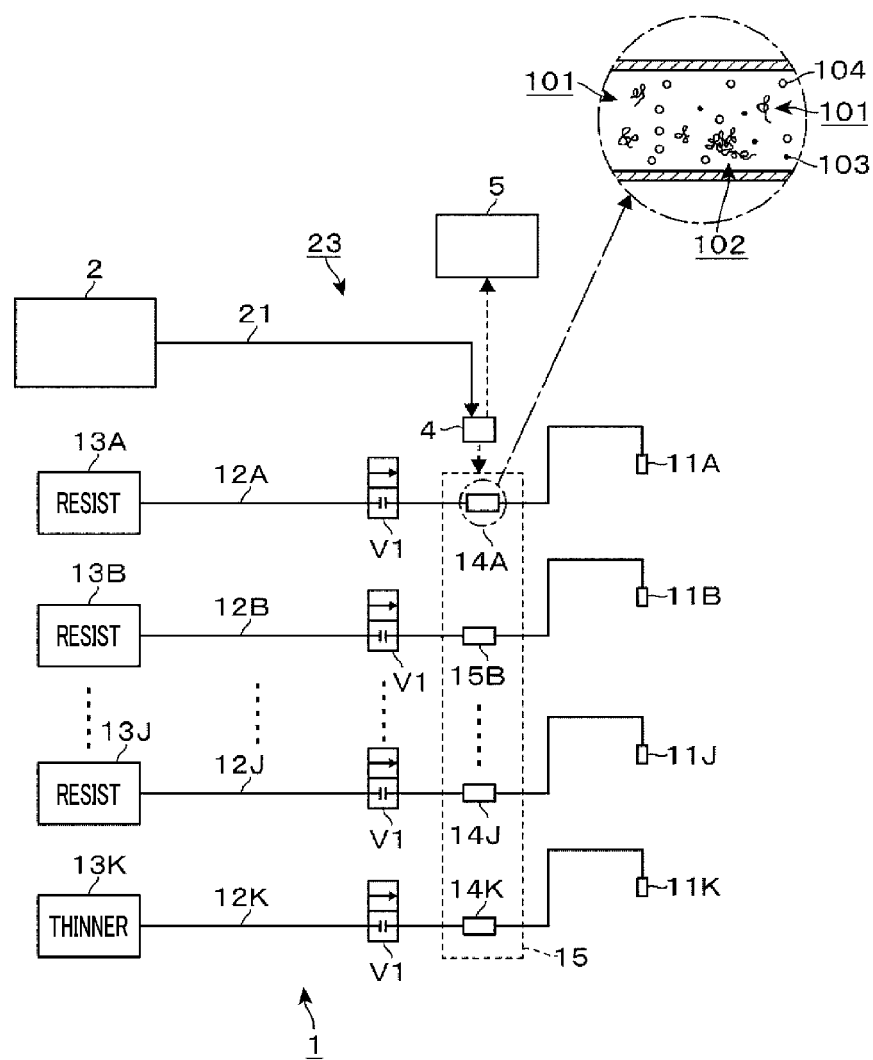
FIG. 1 is a schematic diagram of a resist coating device according to an exemplary embodiment.

FIG. 1 is a schematic diagram of a resist coating device 1 as a coating film forming device. The resist coating device 1 is configured to supply a resist as a chemical solution to a wafer W which is a substrate as a target object. The resist contains a polymer as a main component, and a resist film is formed on the wafer W by the polymer. The resist coating device 1 is equipped with a flow path of the resist, and configured to supply the resist flowing through the flow path to the wafer W and optically detect an abnormality in a state of the polymer in the flow path. Therefore, the detection of the abnormality in the state of the polymer in the resist and the supply of the resist to the wafer W are performed at the same time. The abnormality in the state of the polymer will be described in detail below and may include an abnormality in a shape and a size of the polymer and an abnormality in a concentration.

The resist coating device 1 as a liquid processing device includes a light supply 2 and an optical detection unit 4, and a laser beam output from a light source provided in the light supply 2 is guided to the optical detection unit 4 by a fiber 21 so that the above-described optical detection of the abnormality is performed. In a dotted line frame indicated by a chain line arrow in FIG. 1, a resist flowing through the flow path is schematically illustrated. Reference numeral 101 in the drawing denotes a normal polymer and reference numeral 102 in the drawing denotes an abnormal polymer which is excessively large in size. Also, reference numerals 103 and 104 in the drawing denote components of the resist other than the polymers.

The following is a possible cause that the above-described abnormal polymer 102 is generated. While a chemical solution is produced or preserved, a polymer in which polarity or bonding group is abnormal can be generated stochastically. If another polymer approaches the polymer in which polarity or bonding group is abnormal, the polymers are bonded to each other by hydrophilic groups of the respective polymers and aggregated as GEL so that the above-described abnormal polymer 102 is formed. The abnormal polymer 102 generated as described above loses the solubility to a developing solution, and, thus, the resist film is considered to have the defects as described above in Background.

Further, the resist may contain metallic ions such as Fe or Cu as components thereof. In this case, a plurality of polymers is aggregated to the respective metallic ions in the form of lint to form the abnormal polymer 102, and a reactive group of the polymer to the developing solution is included inside the lint. Accordingly, the polymer loses the solubility to the developing solution, and, thus, the above-described defects may occur.

The excessively large polymer may be formed in a bottle which is located in a cold, dark place and in which the resist is preserved. Further, after the bottle is installed in a device, the excessively large polymer may be generated due to particles present in a flow path of the device. Also, after the bottle in which the resist is preserved is shipped from a manufacturer, the resist may deteriorate depending on the transport state or storage state so that the concentration of the polymer contained in the chemical solution is likely to be different from a predetermined value. If the concentration of the polymer is changed as such, a thickness of a film formed on the wafer may be different from a set value.

For the above-described reasons, polymers having various sizes are contained in the resist. The resist coating device 1 is configured to monitor a state of the normal polymer in these polymers to detect the abnormality. The normal polymer refers to a polymer having a size that predominates in forming the resist film. Therefore, a polymer which has changed to have an exceptional size in the resist is excluded. That is, a majority of polymers contained in the resist are to be monitored. A specific example of the majority of polymers will be described. In a graph in which the horizontal axis indicates the optical particle diameter of the polymer and the longitudinal axis indicates the number of the polymers, the distribution curve of detected polymers exhibits a substantially Gaussian distribution. In this distribution, polymers included in an optical particle diameter range which is set to include the median value of optical particle diameters and include the majority of detected polymers are, for example, the majority of polymers. Therefore, for example, assuming that the standard deviation of the optical particle diameters is $\sigma$, polymers having an optical particle diameter in the range of from $-3\sigma$ to $+3\sigma$ are considered to be monitored. That is, polymers having an optical particle diameter with a deviation from the average value of $\pm 3\sigma$ or less are considered to be monitored.

The polymers to be monitored are relatively small in size. Therefore, in the resist coating device 1, an abnormality is detected based on a weak signal output from a light receiving element corresponding to the normal polymer, and the signal has been conventionally used as a background signal for detecting a foreign matter in a liquid. Further, the above-described Patent Document 2 describes that the intensity of a signal from a light receiving element that receives light passing through a flow path of a chemical solution varies depending on a concentration of the polymer in the chemical solution. However, in Patent Document 2, a polymer having an abnormal size among the polymers of various states contained in the chemical solution is detected as the foreign matter. That is, a small number of polymers among the polymers contained in the chemical solution are detected so as to have the Gaussian distribution as described above. That is, Patent Document 2 does not describe monitoring of the state of the polymers corresponding to the majority of polymers contained in the chemical solution and detecting of the abnormality in that state as described in the present disclosure. Herein, the above-described optical particle diameter refers to a particle diameter of a polymer that is optically detected, and the detection of the abnormality in the optical particle diameter means detecting of the abnormality in the shape of the polymer in addition to the abnormality in the size of the polymer. This is because when the polymers are aggregated and changed in size, the shape of the polymer is considered to be changed.

Returning to the description of the configuration of the resist coating device 1, the resist coating device 1 is equipped with, for example, eleven (11) nozzles 11A to 11K, and ten (10) nozzles 11A to 11J thereof are configured to discharge a resist to the wafer W. The nozzle 11K is configured to discharge a thinner to the wafer W. The thinner is a chemical solution for pre-wetting and serves to improve the wettability of the resist. Downstream ends of chemical solution supply lines 12A to 12J are respectively connected to the nozzles 11A to 11J, and upstream ends of the chemical solution supply lines 12A to 12J are respectively connected to resist supplies 13A to 13J via valves V1. Each of the resist supplies 13A to 13J is equipped with a bottle in which a resist is preserved and a pump configured to force-feed the resist supplied from the bottle to corresponding one of the nozzles 11A to 11J. The types of resists preserved in the respective resist supplies 13A to 13J are different from each other, and one type of the resist selected from the ten types of resists is supplied to the wafer W.

The nozzle 11K is connected to a downstream end of a chemical solution supply line 12K, and an upstream end of the chemical solution supply line 12K is connected to a thinner supply 13K via a valve V1. The thinner supply 13K has the same configuration as the resist supplies 13A to 13J except that the thinner is preserved therein instead of the resist. That is, when the wafer W is processed, the timings at which the chemical solution flows through the chemical solution supply lines 12A to 12K are different from each other. The chemical solution supply lines 12A to 12K are equipped with cuvettes 14A to 14K configured as flow paths of the chemical solutions between the nozzles 11A to 11K and the valves V1, respectively. The optical detection unit 4 irradiates a laser beam to the cuvettes 14A to 14K. Also, the reason for irradiating the laser beam even to the cuvette 14K in which the thinner as the chemical solution flows is to detect a foreign matter other than the polymers as described below.

Figure 2:
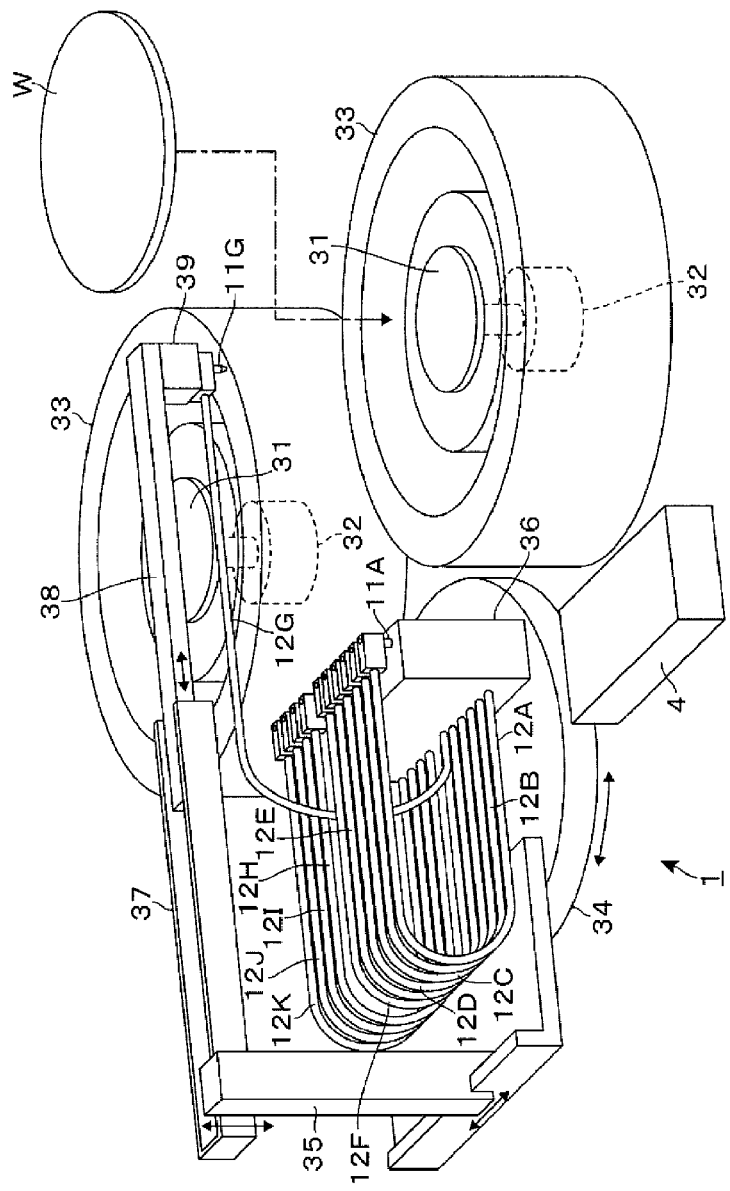
FIG. 2 is a perspective view illustrating the resist coating device.

FIG. 2 shows an example of a further detailed configuration of the resist coating device 1. In the drawing, a reference numeral 31 denotes a spin chuck configured as a placing section to horizontally attract and hold a central portion of a rear surface of the wafer W. In the drawing, a reference numeral 32 denotes a rotation mechanism configured to rotate the spin chuck 31 and thus rotate the wafer W around a vertical axis. The rotation mechanism 32 serves as a thickness adjustment mechanism configured to adjust the thickness of the resist film. Further, the rotation mechanism 32 and a controller 5, which will be described later, configured to control the operation of the rotation mechanism 32 form a handling mechanism configured to handle the abnormalities. In the drawing, a reference numeral 33 denotes a cup configured to suppress scattering of the chemical solution and surround, from below and from the side, the wafer W held on the corresponding spin chuck 31. In the drawing, a reference numeral 34 denotes a rotary stage configured to be pivotable around a vertical axis, and a vertical supporting column 35 configured to be horizontally movable and a holder 36 for the nozzles 11A to 11K are provided on the rotary stage 34. Further, a reference numeral 37 denotes an elevating unit configured to be movable up and down along the supporting column 35, and a reference numeral 38 denotes an arm provided in the elevating unit 37 and configured to be movable in a horizontal direction orthogonal to a moving direction of the supporting column 35. An attaching/detaching mechanism 39 for the nozzles 11A to 11K is provided at a tip end of the arm 38. The nozzles 11A to 11K are moved between a position above the spin chuck 31 and the holder 36 by cooperation of the rotary stage 34, the supporting column 35, the elevating unit 37 and the arm 38.

Figure 3:
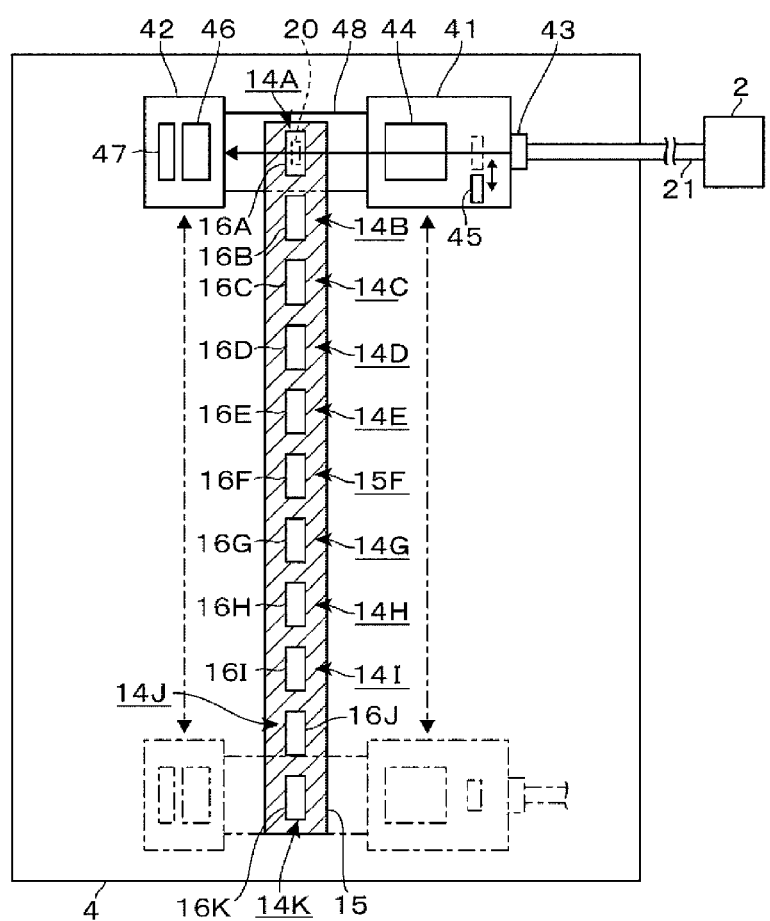
FIG. 3 is a plan view illustrating an optical detection unit provided in the resist coating device.

The optical detection unit 4 is provided, for example, at the side of the rotary stage 34 and the cup 33. The optical detection unit 4, the light supply 2, the cuvettes 14A to 14J and the controller 5 to be described later form a foreign matter detection device 23 of the chemical solution. FIG. 3 is a plan view of the optical detection unit 4. The optical detection unit 4 includes a laser beam irradiator 41, a light receiver 42 and a flow path array 15 composed of the cuvettes 14A to 14K, and is configured to detect the state of the polymer using, for example, a forward scattered light. That is, when a light receiving element receives a scattered light generated by the polymer, the detection of the polymer is performed based on the signal outputted from the light receiving element. A downstream end of the fiber 21 is connected to the laser beam irradiator 41 via a collimator 43. The laser beam irradiator 41 is equipped with an optical system 44 and a shutter 45 configured to open/close an optical path, for example, between the collimator 43 and the optical system 44, and in a state in which the optical path is opened, the laser beam is irradiated to the flow path array 15.

Figure 4:
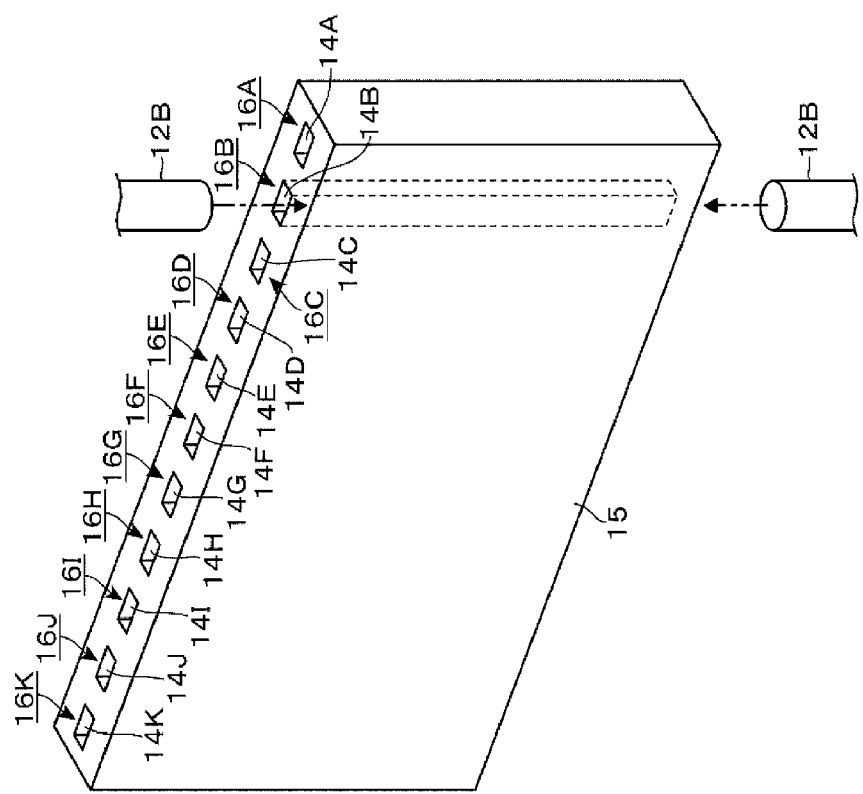
FIG. 4 is a perspective view illustrating a flow path array forming the optical detection unit.

FIG. 4 illustrates the flow path array 15. The flow path array 15 is made of quartz and configured as a transversely elongated rectangular block. Further, the flow path array 15 includes eleven (11) through-holes formed in a vertical direction and arranged in series along a horizontal direction. These through-holes are configured as flow paths 16A to 16K of the chemical solutions. Accordingly, the cuvettes 14A to 14K are formed by the respective through-holes and wall portions around the through-holes. The chemical solutions flow through the respective flow paths 16A to 16K from the bottom to the top.

Referring back to FIG. 3, the light receiver 42 is provided to face the laser beam irradiator 41 with the flow path array 15 therebetween in a forward-backward direction, and equipped with an optical system 46 and a light receiving element group 47. In the drawing, a reference numeral 48 denotes a stage configured to support the laser beam irradiator 41 and the light receiver 42 from below the flow path array 15 and configured to be movable in a left-right direction (an arrangement direction of the flow paths 16A to 16K) by a non-illustrated driving mechanism. As the stage 48 is moved, the laser beam irradiator 41 can irradiate a light guided from the fiber 21 to one flow path selected from the flow paths 16A to 16K along the forward-backward direction. Therefore, an optical path is formed in the selected flow path so as to intersect with the flow direction of the chemical solution. Further, the light, which has been irradiated to the flow path 16 and has passed through the flow path 16, enters the light receiver 42 and is irradiated to the light receiving element group 47 via the optical system 46.

Figure 5:
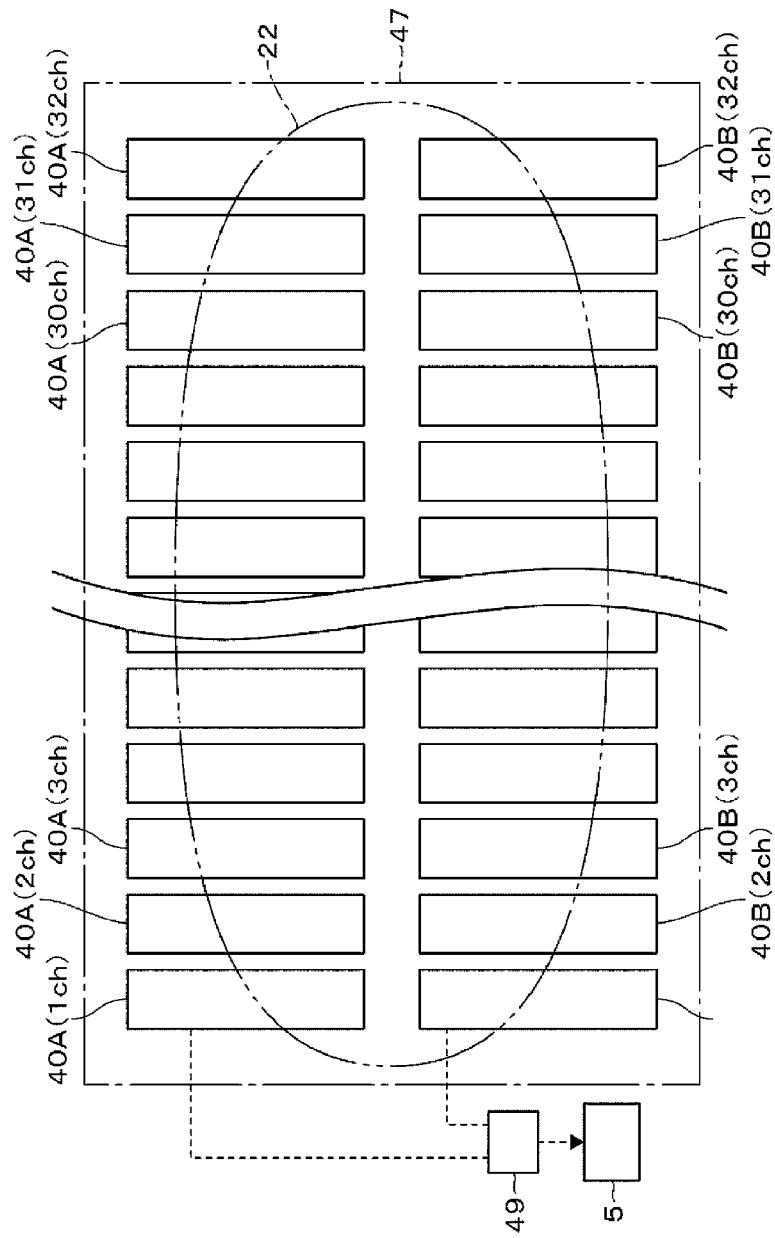
FIG. 5 is a plan view illustrating a light receiving element group forming the optical detection unit.

FIG. 5 is a plan view of the light receiving element group 47. The light receiving element group 47 is composed of sixty-four (64) light receiving elements each configured as a photodiode and placed at a regular interval therebetween to form a matrix of, for example, 2×32. The light receiving elements placed on an upper side are referred to as light receiving elements 40A and the light receiving elements placed on a lower side are referred to as light receiving elements 40B. A light receiving element 40A and a light receiving element 40B located at the same position in the left-right direction make up a set. The sets of the light receiving elements 40A and 40B may be designated by channel numbers 1ch, 2ch, 3ch . . . 32ch in sequence from one of the left side and the right side. Also, in the drawing, a reference numeral 22 denotes a spot of the light irradiated from the laser beam irradiator 41 to the light receiving element group 47 as described above, and the spot 22 has a transversely elongated oval shape so as to range over the light receiving elements 40A and 40B in the respective channels.

The light receiving elements 40A and 40B in the same channel are connected to a circuit unit 49. For example, the circuit unit 49 is configured to amplify signals output from the light receiving elements 40A and 40B in the same channel and outputs a voltage signal, which is a difference therebetween, to the controller 5 to be described later as a detection signal. In FIG. 5, only the circuit unit 49 connected to the light receiving elements 40A and 40B in 1ch is illustrated. However, the circuit unit 49 is provided for the light receiving elements 40A and 40B in each channel. Hereinafter, the circuit units 49 may also be designated by the channel numbers 1ch to 32ch as in the light receiving elements. The reason why the difference between the outputs from the light receiving elements 40A and 40B is used as the detection signal is to remove a noise detected in common from the light receiving elements 40A and 40B.

Further, when the optical path, which is formed in the flow path 16 (16A to 16K) by the light irradiation from the laser beam irradiator 41 and configured as a detection region (denoted by 20 in FIG. 3) for detecting the state of the polymer, is divided into thirty-two (32) divided regions in the left-right direction, the 32 divided regions and the 32 channels of the light receiving elements 40A and 40B correspond to each other on a one-to-one basis. That is, light (reaction light) generated by a reaction with the polymer in one divided region is to be irradiated to the light receiving elements 40A and 40B in one channel corresponding to the one divided region. If the reaction light of the entire detection region 20 is detected by the light receiving elements 40A and 40B in one channel, the noise generated from the entire detection region 20 is output from the light receiving elements 40A and 40B in one channel. As a result, the level of the noise increases, so that the detection accuracy decreases. In order to suppress the decrease in detection accuracy, the divided regions and the channels of the light receiving elements are configured to correspond to each other on the one-to-one basis as described above.

When the optical detection unit 4 is used, the optical particle diameters of the polymers are shown differently depending on the concentration of the polymers. That is, the optical particle diameters of the polymers show the dependency on the concentration of the polymers. Further, the various optical particle diameters imply that at least one of the size or the shape is different. The controller 5 to be described later is configured to detect the concentration of the polymers based on the dependency.

Figure 6:
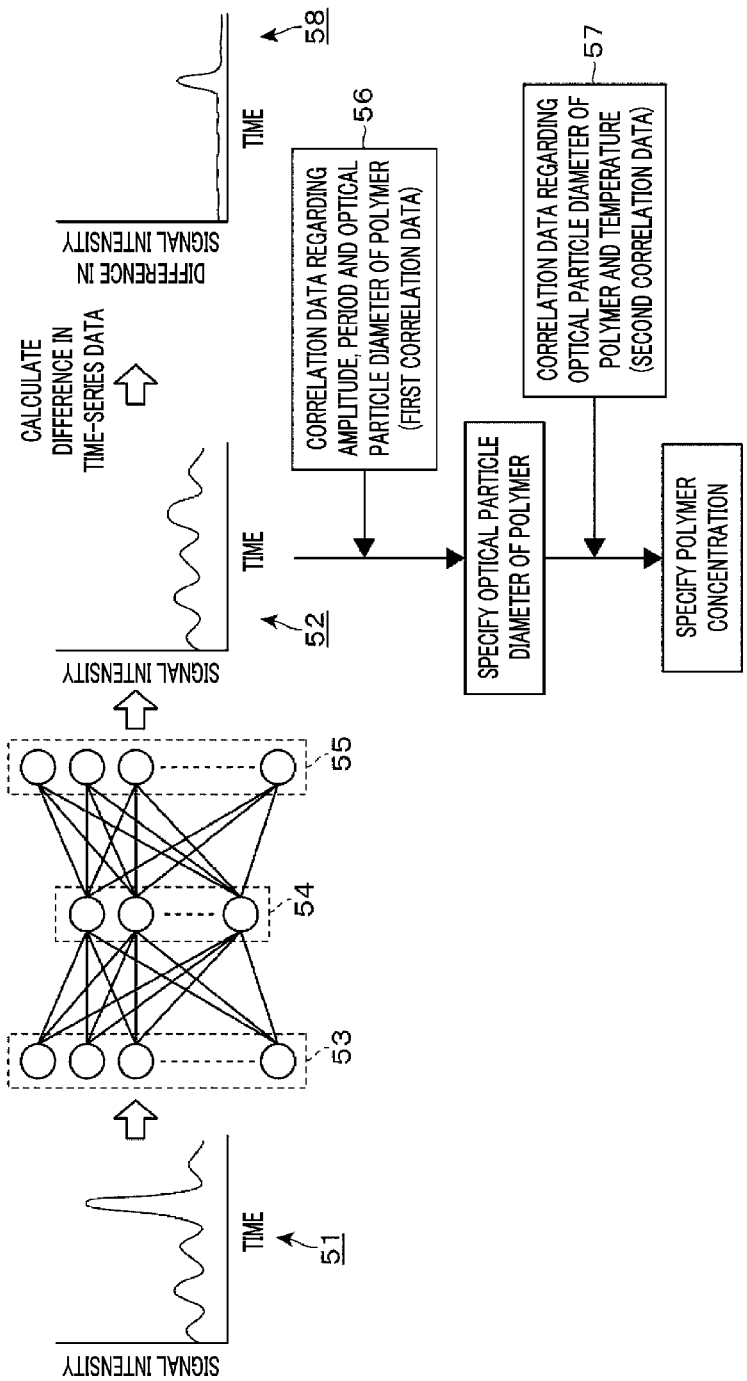
FIG. 6 is a process diagram showing a processing in a controller provided in the resist coating device.

Hereinafter, the controller 5 will be described. The controller 5 is configured by a computer, and each processing performed by the controller 5 will be described below. The controller 5 repeatedly acquires the detection signals output from the circuit units 49 for the channels 1ch to 32ch, respectively, at a predetermined interval while the resist circulates in one of the flow paths 16A to 16J and the light is irradiated to the one flow path, and thus acquires time-series data regarding the voltage intensity (amplitude) of the detection signals for the respective channels. FIG. 6 schematically shows a waveform of time-series data acquired from one channel. For convenience of explanation, this time-series data is referred to as pre-processing time-series data 51. A size of each peak in the pre-processing time-series data 51 corresponds to a size of a matter that has passed through the detection region 20. The controller 5 is configured to detect the abnormality in the state of the normal polymer based on the pre-processing time-series data 51.

The controller 5 analyzes the pre-processing time-series data 51 by an autoencoder method using a neural network to acquire reconstructed time-series data 52. In FIG. 6, reference numerals 53, 54 and 55 respectively denote an input layer, a hidden layer and an output layer that form an autoencoder. Although the hidden layer is a single layer in the drawing, it may be composed of a plurality of layers. In the reconstructed time-series data 52, a normal waveform that repeatedly appears is specified, and the optical particle diameter of the polymer is specified based on the specified waveform and first correlation data 56. The first correlation data 56 is data set for the correlation between an amplitude of the specified waveform and an optical particle diameter of a polymer.

As described above, the sizes of the polymers contained in the resist detected as the optical particle diameters are not uniform. The number of the abnormal sized polymers 102 illustrated in FIG. 1 is smaller than that of the normal sized polymers 101. Thus, when the normal waveform is specified as described above, the normal sized polymers corresponding to the majority in the resist and excluding the abnormal sized polymers 102 are specified. Further, the first correlation data 56 may be correlation data regarding the amplitude and the cycle and the optical particle diameter of the polymer. That is, the optical particle diameter of the polymer may be specified based on the cycle (signal width) of the waveform in addition to the amplitude of the waveform.

Then, the concentration of the polymers in the resist is specified based on the specified optical particle diameter of the polymer and second correlation data 57. As described above, the optical particle diameters of the polymers and the concentration of the polymers are correlated with each other, and the second correlation data 57 is set for the correlation between the optical particle diameters of the polymers and the concentration of the polymers. The first correlation data 56 and the second correlation data 57 are acquired in advance by conducting experiments. Further, it is determined whether the specified optical particle diameter of the polymer and the concentration of polymer are within allowable ranges, respectively, and if they are not within the allowable ranges, it is determined as the abnormality. That is, the presence or absence of the abnormality in the state of the normal polymer is detected.

The reason why the reconstructed time-series data 52 is acquired to detect the abnormality will be described. A signal waveform corresponding to the normal polymer in the pre-processing time-series data 51 is reproduced into an identical or approximately identical signal waveform in the reconstructed time-series data 52 due to the nature of the autoencoder method in which an operation is performed to make the output from the output layer 55 identical with the input to the input layer 53. On the contrary, as for a signal waveform corresponding to the abnormal polymer in the pre-processing time-series data 51, the reproducibility of the signal waveform in the reconstructed time-series data 52 is low. Therefore, when difference time-series data (referred to as error time-series data 58) is acquired by acquiring a difference in signal intensity at the same time for the pre-processing time-series data 51 and the reconstructed time-series data 52, if the signal intensity difference is large, it means the abnormal sized polymer is detected. That is, by acquiring the reconstructed time-series data 52, the waveform corresponding to the abnormal sized polymer can be excluded by comparison with the pre-processing time-series data 51 and the normal waveform for specifying the size of the polymer and the concentration of the polymer can be detected with high accuracy. Besides, if the reproducibility of the autoencoder is generally low for all the acquired signals, it can be determined that a certain abnormality occurs in all of the polymers.

Further, the controller 5 acquires the size of each polymer from the size of each peak of the waveform of the reconstructed time-series data 52 excluding the waveform corresponding to such an abnormal polymer. That is, the size of the normal polymer that predominates in the resist is calculated. Then, the average value of the sizes of the polymers calculated as such is calculated. It is determined whether the average value falls within an allowable range. If the average value does not fall within the allowable range, the abnormality is determined.

Further, regarding the error time-series data 58 described above, a polymer whose peak value is out of a predetermined range is regarded as the abnormal polymer, and the number thereof is counted. Then, for example, it is determined whether the number falls within an allowable range. If the number does not fall within the allowable range, the resist is considered abnormal. In addition, a polymer having a size different from the average value calculated as described above is specified from the error time-series data 58, and the size of each specified polymer is stored. Each time measurement is performed, the size of each polymer is stored. Further, time-dependent changes in the number and the sizes of the specified polymers are monitored to determine the presence or absence of the abnormality. In a specific example, as for the number of polymers whose size falls within the predetermined range, the numbers acquired by the N-th measurement, the (N+1)-th measurement and the (N+2)-th measurement are denoted by A1, A2 and A3, respectively, and if (A3−A2)−(A2−A1) exceeds a reference value, it is considered abnormal. Furthermore, the concentration of the polymers is also stored each time measurement is performed in the same manner as the above-described size, and time-dependent changes are monitored to determine the presence or absence of the abnormality.

When the concentration of detected polymers is out of an allowable range and is abnormal, if a film is formed using predetermined processing parameters, the film thickness of the resist film formed on the wafer W varies depending on the deviation amount in the concentration of the polymers from the allowable range. Therefore, if the concentration of the polymers is abnormal, it is determined whether (a detection value of the polymer concentration—a reference value of the polymer concentration) falls within a predetermined range (a film thickness adjustable range). When the film thickness is within the film thickness adjustable range, the processing parameters are corrected so that the film thickness of the resist film can be matched with a set value. In this example, as the processing parameters, a correction in which the rotation number after the supply of the resist to the wafer W by the rotation mechanism 32 is corrected is performed and a handling operation in which the amount of resist shaken off from the wafer W by the centrifugal force is adjusted is performed.

The correction of the rotation number of the wafer W described above is performed based on third correlation data 61 set for the correlation between (the detection value of the polymer concentration—the reference value of the polymer concentration) and a correction value of the rotation number of the wafer W. The correction value acquired from the third correlation data 61 is added to the set value of the rotation number, and the wafer W is rotated at the corrected rotation number to perform the processing. The third correlation data 61 is set so that the correction value of the rotation number increases as (the detection value of the polymer concentration—the reference value of the polymer concentration) increases, and, thus, the amount of resist shaken off from the wafer W can increase.

When a foreign matter other than the polymer having a size larger than the polymer passes through the flow paths 16A to 16J of the resist and light is irradiated to the foreign matter, a peak corresponding to the foreign matter is higher than a peak corresponding to the polymer in the pre-processing time-series data 51. The controller 5 detects the foreign matter based on, for example, the pre-processing time-series data 51 and a preset threshold value of the signal intensity for the foreign matter detection. Specifically, a peak of the pre-processing time-series data 51 that exceeds the threshold value is regarded as a peak that represents the foreign matter other than the above-described polymer, and the foreign matter detection (size calculation and counting) is performed based on this peak. Then, it is determined whether there is the abnormality, for example, by comparing the number of foreign matters having the predetermined size with the allowable value. Further, by comparing the pre-processing time-series data 51 with data reproduced by the autoencoder based on the pre-processing time-series data 51, a peak with poor reproducibility may be regarded as the peak representing the foreign matter. Accordingly, as for the flow paths 16A to 16J of the resist, the state of the polymers and the foreign matters other than the polymers are monitored, and as for the flow path 16K of the thinner, the foreign matters other than the polymers are monitored. Therefore, the cleanliness of the chemical solution in each of the flow paths 16A to 16K is monitored.

Further, the pre-processing time-series data 51 can be acquired from each channel of the light receiving elements 40A and 40B, and, thus, the sizes and the concentration of the above-described polymers can be detected for each channel. Accordingly, the finally determined polymer size and polymer concentration can be, for example, respective average values of the values calculated as described above from each channel.

Figure 7:
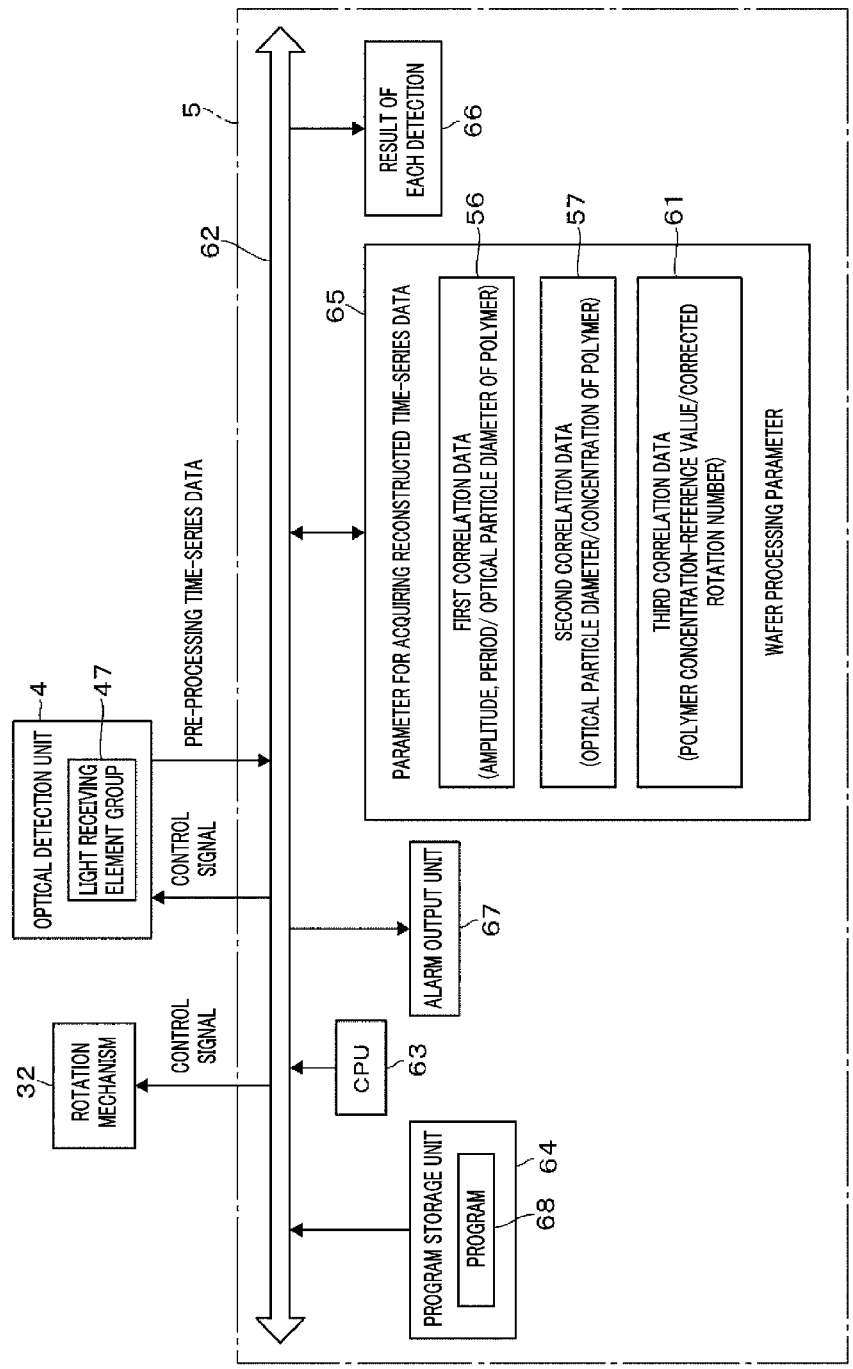
FIG. 7 is a block diagram illustrating a configuration of the controller.

Then, the configuration of the controller 5 will be described with reference to FIG. 7. The controller 5 is configured as a detector configured to detect the abnormality in the state of the polymer as described above and also serves as an analysis processing unit configured to analyze the abnormality. In the drawing, a reference numeral 62 denotes a bus forming the controller 5, and the bus 62 is connected to a CPU 63, a program storage unit 64, memories 65 and 66 and an alarm output unit 67. The program storage unit 64 stores a program 68 in which process groups are recorded to perform the above-described processings and formation of the resist film on the wafer W, which will be described later, and control signals are output to the respective components of the resist coating device 1. Specifically, the opening/closing of the valve V1, the rotation number by the rotation mechanism 32, the operations of the respective components for transferring the nozzles 11A to 11K, the supply of the resist from the resist supplies 13A to 13J, the supply of the thinner from the thinner supply 13K, the operation of the driving mechanism for moving the laser beam irradiator 41 and the light receiver 42 or the opening/closing of the shutter 45 can be controlled by the control signals. The program 68 is stored in a program storage unit 64 while being recorded in a recording medium such as a hard disk, a compact disk, a magneto-optical disc, a memory card or a DVD.

Further, for example, the memory 65 stores various data to perform the processing recorded in the program 68. The data may include parameters such as weight or bias forming the autoencoder for acquiring the reconstructed time-series data 52, the first correlation data 56, the second correlation data 57, the third correlation data 61 and the processing parameters for the wafer W including the rotation number. For example, the memory 66 stores the sizes and the concentration of the polymers acquired each time detection is performed so that time-dependent changes in the sizes of the polymers and time-dependent changes in the concentration of the polymers can be calculated.

When various abnormalities are determined as described above, the alarm output unit 67 outputs an alarm indicating the determination of the abnormality. This alarm is, for example, voice or screen display. However, when the abnormality in the concentration of the polymers is determined, if the correction in which the rotation number is corrected is performed as described above, the alarm is not output.

Figure 8:
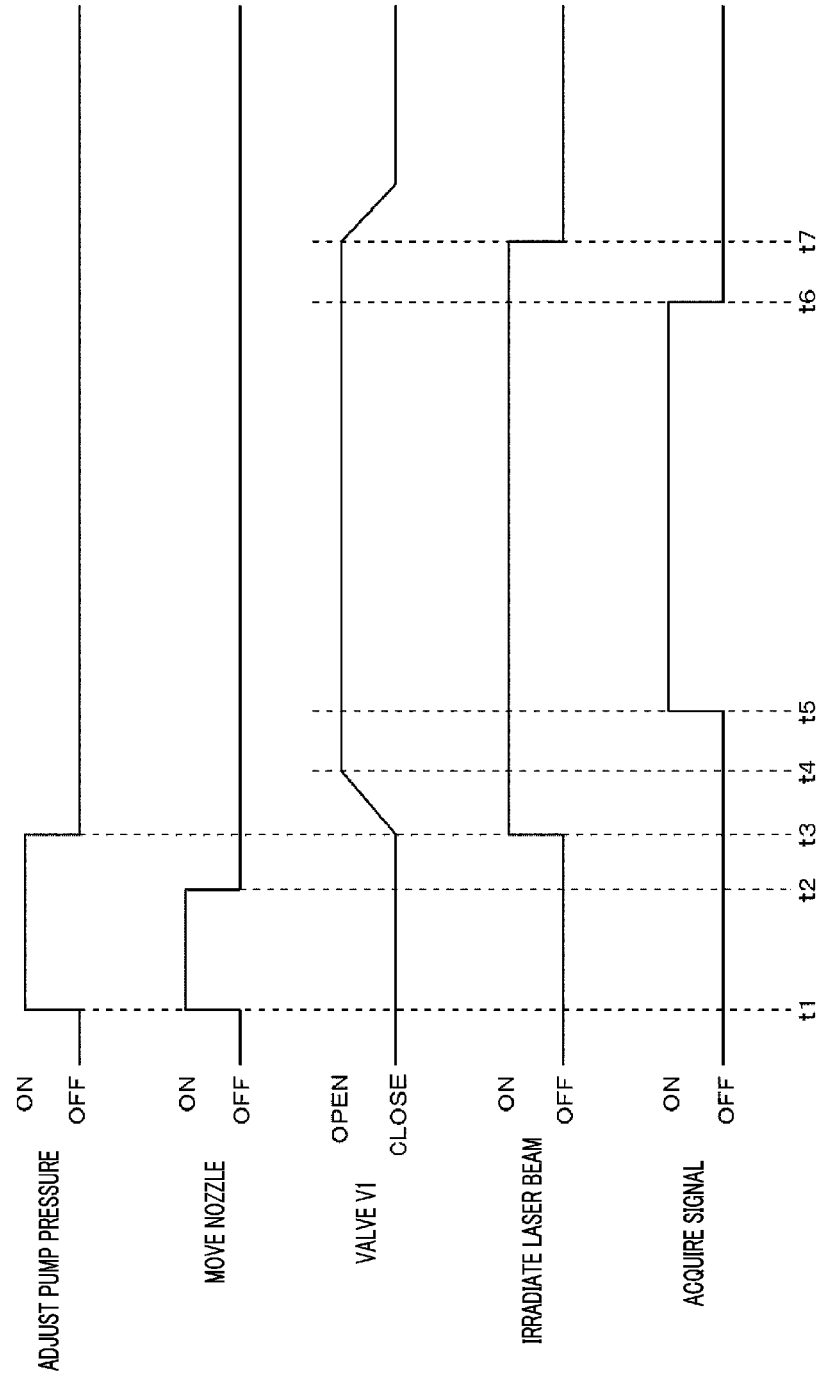
FIG. 8 is a timing chart showing an operation timing of each component of the resist coating device.
Figure 9:
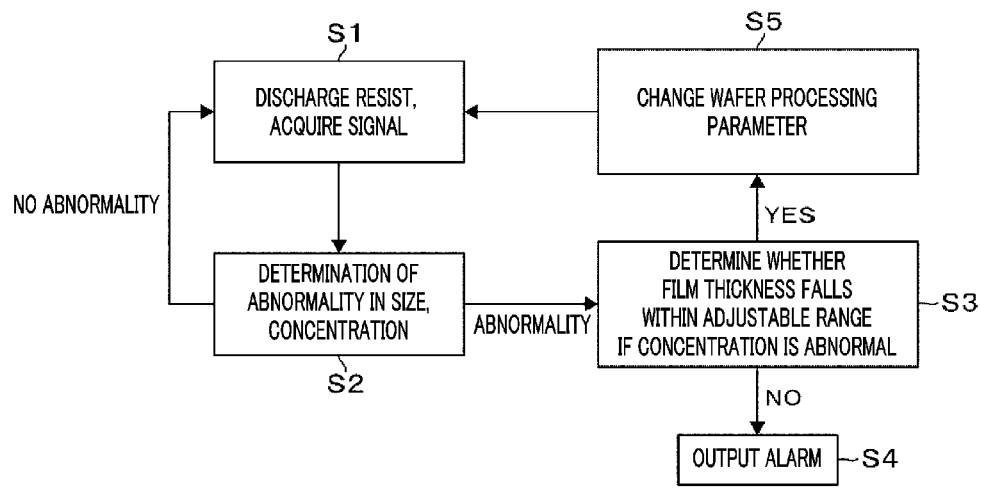
FIG. 9 is a flowchart showing an example of a processing in the controller.

Hereinafter, the operation of the resist coating device 1 will be described with reference to the timing chart of FIG. 8 and the flowchart of FIG. 9. The timing chart of FIG. 8 shows the timing when the pressure of the pump in one of the supplies 13A to 13K is set, the timing when one of the nozzles 11A to 11K is moved by the arm 38, the timing when the valve V1 of one of the chemical solution lines 12A to 12K is opened and closed, the timing when a state where the laser beam is irradiated from the laser beam irradiation unit 41 is switched to a state where the irradiation of the laser beam is stopped and the timing when the controller 5 acquires the signals from the respective channels forming the light receiving element group 47. The timing when the state where the laser beam is irradiated is switched to the state where the irradiation of the laser beam is stopped corresponds to the timing when the shutter 45 of the optical detection unit 4 is opened and closed.

First, in the state where the wafer W is transferred and held on the spin chuck 31, the nozzle 11K is transferred onto the central portion of the wafer W, the pump of the supply 13K operates and the valve V1 of the chemical solution supply line 12K is opened and closed to supply the thinner to the central portion of the wafer W. While the valve V1 is opened, the light is irradiated to the cuvette 14K so that the pre-processing time-series data 51 can be acquired and the foreign matters other than polymers can be detected. As described above, the detection of the foreign matter may be performed based on the peak of the pre-processing time-series data 51 or may be performed by comparing the pre-processing time-series data 51 with the reproduced data acquired by processing the pre-processing time-series data 51 with the autoencoder. Meanwhile, the wafer W is rotated and the thinner spreads to the peripheral portion of the wafer W.

Thereafter, for example, the nozzle 11A is transferred onto the wafer W. Then, the pump of the resist supply 13A sucks the resist to start setting of the pressure to a predetermined pressure (time t1 in the chart). For example, concurrently with the movement of the nozzle and the operation of the pump, the laser beam irradiator 41 and the light receiver 42 move to positions between which the cuvette 14A is interposed. At this time, the shutter 45 of the optical detection unit 4 is closed.

The nozzle 11A stops above the wafer W (time t2) and the wafer W is rotated at a predetermined rotation number. Subsequently, the valve V1 of the chemical solution supply line 12A is opened, and the resist is force-fed from the pump toward the nozzle 11A at a predetermined flow rate. Along with the force-feeding, the shutter 45 is opened, and, thus, the laser beam is irradiated from the laser beam irradiator 41 to pass through the cuvette 14A. As a result, the detection region 20 as the optical path is formed in the flow path 16A inside the cuvette 14A (time t3). Then, the resist force-fed from the flow path 16A passes through the cuvette 14A to be discharged from the nozzle 11A onto the central portion of the wafer W (process S1).

When the opening degree of the valve V1 increases to reach a predetermined opening degree, the increase in the opening degree is stopped (time t4). Then, the acquisition of the signal output from the circuit unit 49 connected to the light receiving elements 40A and 40B in each channel is started. That is, the acquisition of the pre-processing time-series data 51 is started (time t5). Subsequently, the acquisition of the signal output from the circuit unit 49 is stopped (time t6), and the shutter 45 is closed, so that the irradiation of the light from the laser beam irradiator 41 is stopped. Further, the valve V1 of the chemical solution supply line 12A is closed, so that the discharge of the resist onto the wafer W is stopped (time t7).

The controller 5 acquires the reconstructed time-series data 52 and the error time-series data 58 from the pre-processing time-series data 51. Then, as described above with reference to FIG. 6, based on these time-series data, the first correlation data 56 and the second correlation data 57, the sizes of the polymers, the concentration of the polymers, the average value of the sizes of the polymers, time-dependent changes in the sizes of the polymers, time-dependent changes in the concentration of the polymers and the number of polymers having abnormal sizes are detected, and it is determined whether these detection values are abnormal (process S2).

If it is determined in the process S2 that the polymer concentration is abnormal, it is determined whether (the detection value of the polymer concentration—the reference value of the polymer concentration) falls within the film thickness adjustable range (process S3). Further, if it is determined in the process S3 that it falls within the film thickness adjustable range, the correction value of the rotation number of the wafer W is calculated based on the detection value of the polymer concentration and the third correlation data 61, so that the rotation number is corrected (process S4). Then, the wafer W is rotated at the corrected rotation number, and the resist discharged onto the wafer W spreads to the peripheral portion of the wafer W by the centrifugal force, and, thus, the resist film is formed. Then, the wafer Won which the resist film has been formed is carried out of the resist coating device 1. Thereafter, a subsequent wafer W is transferred into the resist coating device 1, and the processes after the process S1 are performed.

If it is determined in the process S3 that (the detection value of the polymer concentration—the reference value of the polymer concentration) is out of the film thickness adjustable range, the alarm is output from the alarm output unit 67 and the processing of the wafer W is stopped. Also, if it is determined in the process S2 that a detection value other than the polymer concentration is abnormal, the alarm is output and the processing of the wafer W is stopped as in the process S4. If it is determined in the process S2 that there is no abnormality in any one of the detection values, the wafer W is rotated at a predetermined rotation number without correcting the rotation number, and, thus, the resist film is formed. Then, a subsequent wafer W is transferred into the resist coating device 1, and the processes after the process S1 are performed.

In the process S2, it is determined whether there is the abnormality of the foreign matters other than polymers. If it is determined that there is the abnormality, the alarm is output and the processing of the wafer W is stopped as in the process S4. Also, in the detection of the foreign matter described above with reference to the chart of FIG. 8, the timing when the valve V1 is opened and closed as described above in order to increase the measurement accuracy by detecting the foreign matter in the state where the liquid flow in the cuvette 14A is stable is different from the timing when the controller 5 starts and ends the acquisition of the output signal. For example, the period between the times t4 and t5 is 10 milliseconds to 1,000 milliseconds and the period between the times t6 and t7 is 10 milliseconds to 100 milliseconds.

In the resist coating device 1, the state of the majority of polymers contained in the resist is optically monitored to determine whether there is the abnormality. As a result, it is possible to suppress the occurrence of the abnormality in the resist film formed on the wafer W and form the resist film with high uniformity on each wafer W. Further, the concentration of the polymers contained in the resist can be monitored as the state of the polymers via the sizes of the polymers, and, thus, the film thickness of the resist film can be highly stable. Furthermore, when it is determined that the concentration of the polymers is abnormal, if the difference between the concentration and its reference value is small (falls within the above-described film thickness adjustable range), the processing parameters are automatically changed. Thus, the film thickness of the resist film is adjusted to the set value. Therefore, it is possible to suppress the waste of the wafer W caused by the abnormal concentration of the polymers. Also, as described above, the detection of the abnormal polymer at the specific position in the flow path of the resist and the detection of the foreign matter other than polymers contribute to estimation of which position in the flow path of the resist is a source of a matter that causes resist abnormality in resist film. Therefore, when resist abnormality is detected, the time required for restoration of the device can be shortened.

Herein, waveforms (referred to as "reference waveforms") of the signal intensity time-series data respectively corresponding to different resist polymer concentrations or different polymer mass numbers may be stored in the memory 65 of the controller 5. Further, the controller 5 has learning data for the autoencoder for each chemical solution so that the reference waveform can be reproduced depending on the state of each chemical solution. When the pre-processing time-series data 51 is acquired, it is checked which learning data is used to calculate the time-series data to reduce the difference between the calculated time-series data and the reference waveforms stored in the memory 65. A chemical solution corresponding to the learning data with the smallest difference is determined having an affinity. Then, the properties of the polymer in the chemical solution which has been determined having the affinity may be determined as the properties of the polymer in the measured resist. Therefore, in the example described with reference to FIG. 6, the polymer size is specified using the reconstructed time-series data 52 and the first correlation data 56, and the resist concentration is specified using the polymer size and the second correlation data 57, but do not have to be sequentially specified.

As described above, the mass number of the polymer can be estimated, and, thus, the abnormality in the mass number may be determined. Also, the signal acquired from the light receiving element group 40 includes information on the refractive index of the polymer. Therefore, the abnormality in the state of the detected polymer may include the abnormality in the refractive index. That is, the detection of the abnormal state of the polymer is not limited to the detection of the size and the concentration.

When it is determined that the polymer concentration is abnormal, the processing parameters to be corrected are not limited to the rotation number of the wafer W. For example, the timing of closing the valve V1 described as the time t7 in FIG. 8 may be changed. That is, the detection value—the reference value of the polymer concentration is calculated, and as the calculated value, i.e., the polymer concentration, decreases, the interval from the opening to the closing of the valve V1 increases. As a result, the timing of closing the valve V1 is adjusted such that a large amount of resist is supplied to the wafer W. Accordingly, the valve V1 is configured as a supply amount adjustment mechanism configured to adjust the supply amount of the chemical solution. The timing of closing the valve V1 may be changed when the abnormality in the polymer concentration is detected or after the abnormality in the polymer concentration is detected.

Figure 10:
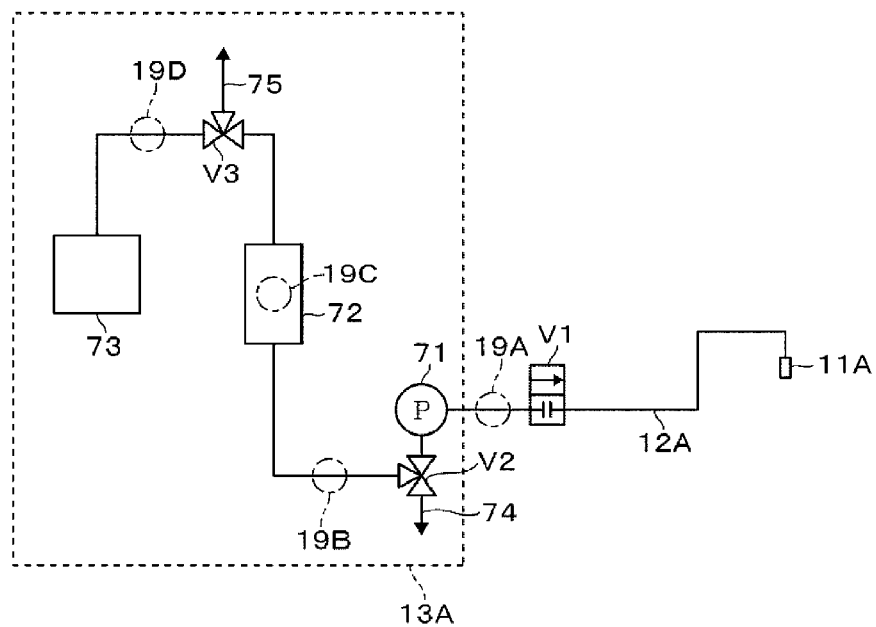
FIG. 10 is a schematic diagram illustrating a configuration of a resist supply provided in the resist coating device.

In the resist coating device 1 shown in FIG. 1, the cuvettes 14A to 14J forming a light irradiation region to be irradiated with the laser beam are provided near the nozzles 11A to 11J at a more downstream side than the valve V1 in the chemical solution supply lines 12A to 12J, respectively. Therefore, the state of the resist immediately before being supplied to the wafer W can be monitored with high accuracy, and, thus, it is possible to more reliably suppress the occurrence of the abnormality in the resist film to be formed. However, the positions of the cuvettes 14A to 14J are not limited thereto. Specifically, another example of the position of the cuvette 14A will be described with reference to FIG. 10 showing an example of the configuration of the resist supply 13A.

First, the configuration of the resist supply 13A will be described. The resist supply 13A includes a pump 71, a downstream three-way valve V2, a tank 72, an upstream three-way valve V3 and a bottle 73. The pump 71, the downstream three-way valve V2, the tank 72 and the upstream three-way valve V3 are arranged in the chemical solution supply line 12A in this order from the upstream side of the valve V1 toward the more upstream side. The bottle 73 serving as a resist reservoir is connected to the upstream end of the chemical solution supply line 12A. The upstream ends of pipes 74 and 75 each forming a branch path are connected to the downstream three-way valve V2 and the upstream three-way valve V3, respectively, and the downstream ends of the pipes 74 and 75 are connected to a non-illustrated drain path. However, the downstream ends of these pipes 74 and 75 may be connected to, for example, a tank that collects the resist for reuse. The upstream three-way valve V3 and the downstream three-way valve V2 forming a resist supply switching unit are normally in a state where the resist can be circulated from the upstream side to the downstream side of the chemical solution supply line 12A, so that, the resist is not supplied to the pipes 74 and 75 in this state.

In the drawing, instead of the position between the valve V1 and the nozzle 11A, positions where the optical detection is performed is indicated by a chain line circle as positions 19A to 19D. That is, the cuvette 14A may be provided at these positions 19A to 19D. The position 19A is between the valve V1 and the pump 71 in the chemical solution supply line 12A, the position 19B is between the tank 72 and the downstream three-way valve V2 in the chemical solution supply line 12A, and the position 19C is at the tank 72. Also, the position 19D is between the upstream three-way valve V3 and the bottle 73 in the chemical solution supply line 12A. More specifically, the position 19C at the tank 72 means that the cuvette 14A may be installed near the upstream side of the tank 72 or the downstream side of the tank 72 in the chemical solution supply line 12A.

If the cuvette 14A is provided at the position 19A which is downstream end of the pump 71, the detection is performed at the timing described above in the timing chart of FIG. 8, i.e., during the period in which the resist is discharged from the pump 71. If the cuvette 14A is provided at the positions 19B to 19D which are the upstream ends of the pump 71, the detection is performed during the period in which the pump 71 absorbs the liquid and the pressure is set at the times t1 to t3 described above in the timing chart of FIG. 8.

If the cuvette 14A is provided at the positions 19B to 19D as described above, for example, if the abnormality in the polymer concentration is detected and it is determined that the detection value does not fall within the film thickness adjustable range, the opening/closing state of the downstream three-way valve V2 is switched. Thus, the supply destination of the resist from the downstream three-way valve V2 is switched from the nozzle 11A to the pipe 74 and the resist is drained. Therefore, since the resist regarded as having the abnormality in the polymer concentration is not supplied into the nozzle 11A, it is possible to suppress the waste of the wafer W. Also, for example, even when it is determined that the abnormality occurs in any target other than the polymer size and the polymer concentration, the opening/closing state of the downstream three-way valve V2 is switched and the resist is drained through the pipe 74 in the same manner. Further, when the optical detection is performed at the position 19D, the opening/closing state of the upstream three-way valve V3 instead of the downstream three-way valve V2 may be switched and the resist may be drained through the pipe 75. A handling mechanism configured to handle the abnormalities is composed of the downstream three-way valve V2 or the upstream three-way valve V3 and the controller 5 configured to control the operations of these valves.

Further, the resist supply 13A may be configured to switch the thinner that is a cleaning solution for cleaning the chemical solution supply line 12A and the resist to each other and supply it into the chemical solution supply line 12A. After the abnormality in the state of the polymer is detected in the cuvette 14A, the chemical solution supply line 12A is supplied with the thinner and cleaned. While the chemical solution supply line 12A is cleaned, the reconstructed time-series data 52 is acquired. When a signal corresponding to the foreign matter and the abnormal polymer specified from the reconstructed time-series data 52 has a specific frequency or less, the cleaning processing is ended. When the number of the polymers having the predetermined size is larger than the reference value, the control by the controller 5 may be performed to continue the cleaning processing. That is, the timing of ending the cleaning processing may be determined based on the reconstructed time-series data 52. With this configuration, the chemical solution supply line 12A can be reliably cleaned and the consumption amount of the thinner can be suppressed so that the processing on the wafer W cannot be affected. Although the resist supply 13A has been described, the other resist supplies 13B to 13J can also be configured similarly to the resist supply 13A.

Figure 11:
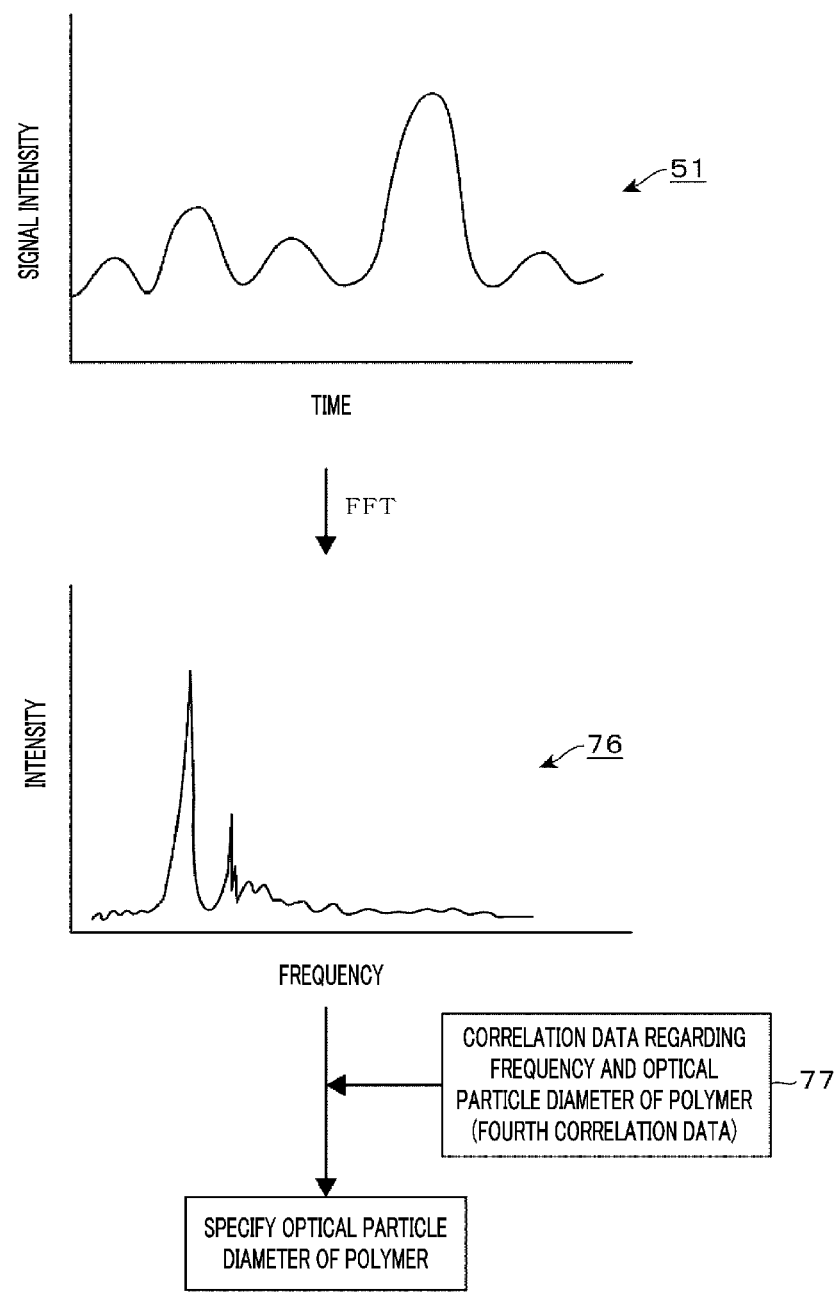
FIG. 11 is a process diagram showing another example of the processing in the controller.

Herein, the program 68 of the controller 5 is configured as the autoencoder to perform the analysis processing on the pre-processing time-series data 51. However, the analysis processing performed by the program 68 is not limited to the processing performed by the autoencoder. The analysis processing as used herein refers to, for example, a processing of differentiating the ratio of the magnitudes of peaks of the signal waveform before and after the processing as in this autoencoder method, or a processing of acquiring a relationship different from the relationship between the signal intensity and the time. Specifically, this analysis processing includes FFT (Fast Fourier Transform). For example, the program 68 performs the FFT on the pre-processing time-series data 51 as shown in FIG. 11 to acquire a frequency spectrum 76 indicating the relationship between the frequency and the signal intensity, and based on this frequency spectrum 76, the program 68 may be configured to detect the presence or absence of the abnormality in the state of the polymer.

More specifically, fourth correlation data 77 set for the correlation between the frequency after the FFT and the polymer size is stored in the memory 65. Then, a polymer having a predominant size in the resist shows a high peak in the acquired frequency spectrum 76, and, thus, the frequency at the highest peak is specified. Based on the specified frequency and the fourth correlation data 77, the predominant size of the polymers in the resist is specified. Thereafter, as shown in FIG. 6, the polymer concentration is also specified based on the polymer size, and the abnormality in each of the polymer size and the polymer concentration can be detected.

Figure 12:
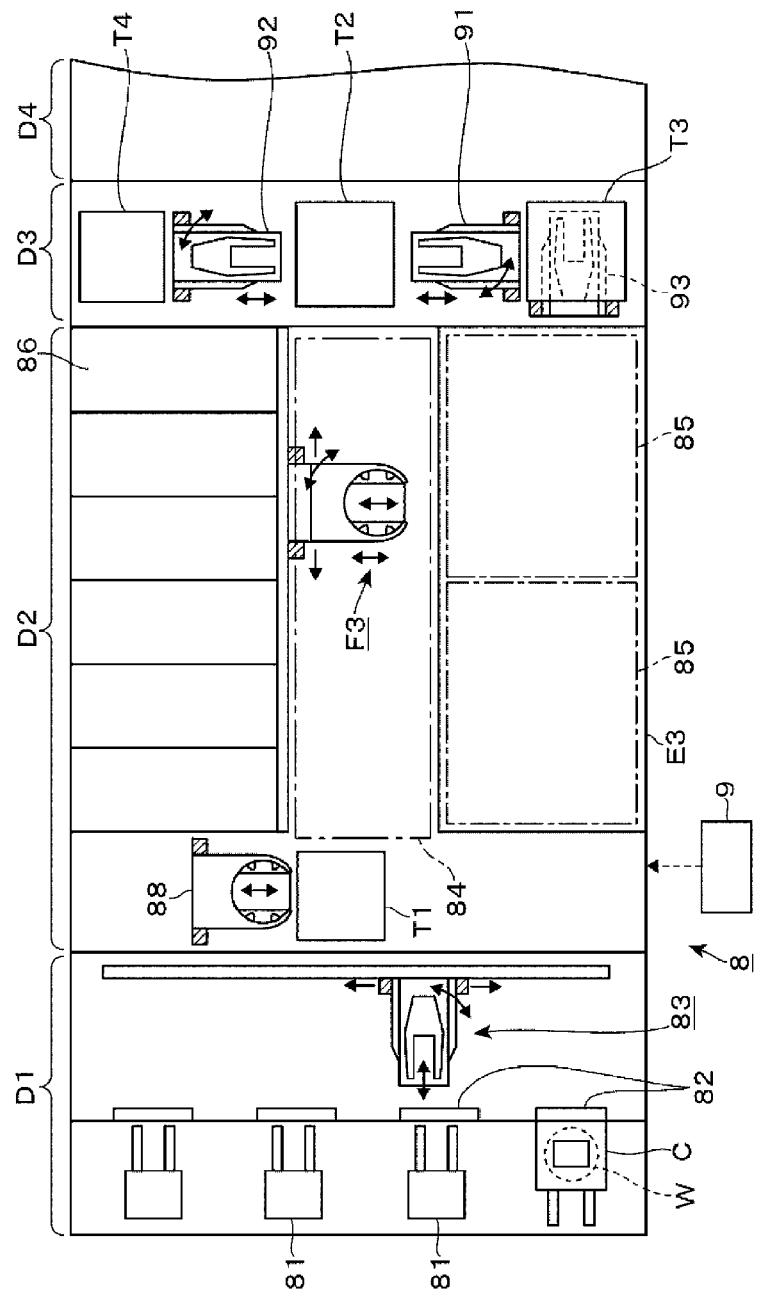
FIG. 12 is a plan view of a coating/developing device including the resist coating device.
Figure 13:
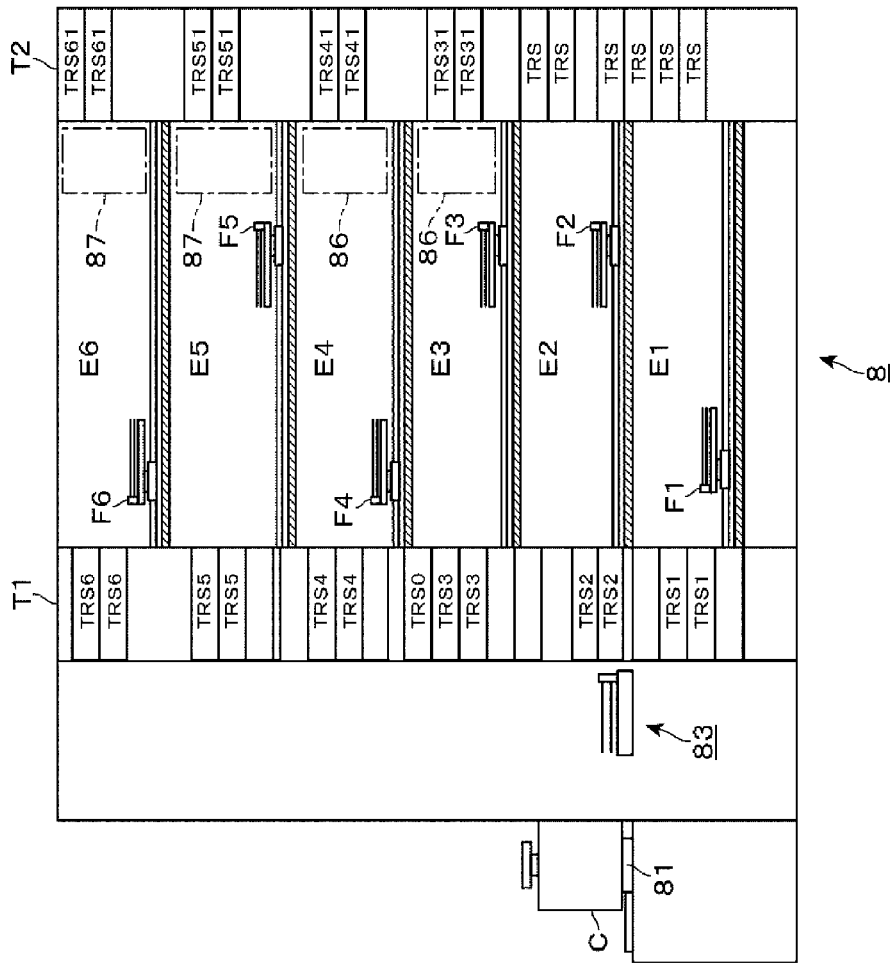
FIG. 13 is a longitudinal side view of the coating/developing device.

Hereinafter, a coating/developing device 8 as the substrate processing apparatus equipped with the above-described resist coating device 1 as a resist coating module will be described with reference to the plan view and the longitudinal side view in FIG. 12 and FIG. 13, respectively. The coating/developing device 8 is configured by linearly connecting a carrier block D1, a processing block D2 and an interface block D3 in a horizontal direction, and the interface block D3 is connected to an exposure device D4. In the following description, an arrangement direction of the blocks D1 to D3 will be defined as a forward-backward direction. The carrier block D1 includes a mounting table 81 for a carrier C, an opening/closing unit 82 and a delivery arm 83 configured to transfer a wafer W from the carrier C via the opening/closing unit 82.

The processing block D2 is configured by stacking first to sixth unit blocks E1 to E6 each configured to perform a liquid processing and a heat treatment on the wafer W in order from the bottom. In each unit block, the wafer W is transferred and processed concurrently. Further, the unit blocks E1 and E2 are same, the unit blocks E3 and E4 are same, and the unit blocks E5 and E6 are same. The wafer W is transferred to either one of the same unit blocks.

The unit block E3 as a representative of the unit blocks will be described with reference to FIG. 12. A shelf unit U is provided at one of the left and right sides of a transfer region 84 ranging from the carrier block D1 toward the interface block D3, and resist coating modules 85 as the resist coating device 1 are arranged in the forward-backward direction. The shelf unit U includes a heating module 86 configured to heat the wafer W on which the resist film has been formed. In the transfer region 84, a transfer arm F3 configured to access each module provided in the unit block E3 and each module provided at the same height as the unit block E3 in towers T1 and T2, which will be described later, and transfer the wafer W is provided.

The unit blocks E1 and E2 have the same configuration as the unit block E3 except that they are equipped with an antireflection film forming module configured to apply a chemical solution for forming an antireflection film to the wafer W instead of the resist coating module 85 and the shelf unit U is equipped with a heating module configured to heat the wafer W on which the antireflection film has been formed. The unit blocks E5 and E6 have the same configuration as the unit block E3 except that they are equipped with a developing module instead of the resist coating module 85 and the shelf unit U is equipped with a heating module 87 configured to perform a heat treatment after exposure and before development (PEB). Also, a plurality of heating modules 86 and 87 is provided in each unit block, but FIG. 13 illustrates only one heating module in each unit block. In FIG. 13, transfer arms respectively belonging to the unit blocks E1 to E6 are indicated by F1 to F6.

On the side of the carrier block D1 in the processing block D2, the tower T1 vertically extended along the unit blocks E1 to E6 and a vertically movable delivery arm 88 configured to deliver the wafer W to the tower T1 are provided. The tower T1 includes a plurality of delivery modules TRS stacked one on another. In the delivery module TRS, the wafer W is temporarily placed to be delivered to each block.

The interface block D3 includes towers T2, T3 and T4 vertically extended along the unit blocks E1 to E6, a vertically movable interface arm 91 configured to deliver the wafer W to the tower T2 and the tower T3, a vertically movable interface arm 92 as a transfer mechanism configured to deliver the wafer W to the tower T2 and the tower T4, and an interface arm 93 configured to deliver the wafer W between the tower T2 and the exposure device D4.

Although the tower T2 is formed by stacking a delivery module TRS, a buffer module in which a plurality of wafers W before being exposed is stored and stocked, a buffer module in which a plurality of wafers W after being exposed is stored and a temperature adjustment module configured to adjust the temperature of the wafer W, illustration of these modules other than the delivery module TRS is omitted herein. Although the towers T3 and T4 are also equipped with modules, an explanation thereof is omitted herein.

A transfer route of the wafer W in the coating/developing device 8 will be described. The wafer W is transferred by the delivery arm 83 from the carrier C to a delivery module TRS0 of the tower T1, and then, the wafer W is distributed and transferred to the unit blocks E1 and E2 from the TRS0. When the wafer W is delivered to the unit block E1, the wafer W is delivered from the TRS0 to a delivery module TRS1 (the transfer module capable of delivering the wafer W by the transfer arm F1) corresponding to the unit block E1 among the delivery modules TRS of the tower T1. Also, when the wafer W is delivered to the unit block E2, the wafer W is transferred from the TRS0 to a delivery module TRS2 corresponding to the unit block E2 among the delivery modules TRS of the tower T1. The delivery of the wafer W is performed by the delivery arm 88.

The distributed wafer W is sequentially transferred to the TRS1 (TRS2), the antireflection film forming module, the heating module and the TRS1 (TRS2). Then, the wafer W is distributed by the delivery arm 85 to a delivery module TRS3 corresponding to the unit block E3 and a delivery module TRS4 corresponding to the unit block E4. The wafer distributed to the TRS3 and TRS4 is sequentially transferred to the resist coating module 85 and the heating module 86, and then, transferred to a delivery modules TRS31 (TRS41) of the tower T2.

Thereafter, the wafer W is transferred to the exposure device D4 by the interface arms 91 and 93. The wafer W after being exposed is transferred by the interface arms 92 and 93 to transfer modules TRS51 and TRS61 of the tower T2 corresponding to the unit blocks E5 and E6, respectively. Then, the wafer W is sequentially transferred to the heating module 87 and the developing module. After, a resist pattern is formed on the wafer W, the wafer W is transferred to the transfer module TRS5 (TRS6) of the tower T1 and returned to the carrier C via the delivery arm 83.

Herein, the coating/developing device 8 includes a controller 9. The difference between the controller 9 and the above-described controller 5 will be described. A program included in the controller 9 is configured to transfer the wafer W and perform the processings as described above. Also, the controller 9 does not stop the processings on the wafer W even if the polymer concentration of in the resist in the resist coating module 85 is abnormal. Therefore, a resist film having a film thickness different from a set value is formed and transferred to each subsequent module. In the coating/developing apparatus 8, when the polymer concentration is abnormal, i.e., when the resist film thickness is abnormal, if the influence on a CD (Critical Dimension) including the shape or the position of the resist pattern is already known, the heating temperature of the wafer W in the heating module 86 or 87 may be corrected in order to suppress the influence on the CD.

Specifically, the correlation data between (a detection value—a reference value) of the polymer concentration and the correction amount of the heating temperature is stored in advance in a memory included in the controller 9. When the polymer concentration is abnormal, the correction amount of the heating temperature in the heating module 86 or 87 is calculated based on the correlation data, and the wafer W is heated at the corrected heating temperature. A resultant deviation of the shape and the position of the resist pattern from the set values may be suppressed. Therefore, in the coating/developing device 8, the wafer W is heat-treated at a temperature depending on the presence or absence of the abnormality in the state of the chemical solution. Further, the processing parameter to be corrected may be the heating time of the wafer W in the heating module 86 or 87 instead of the heating temperature.

Although there has been described an example in which the above-described controller 5 performs the analysis processing of the pre-processing time-series data 51 by the autoencoder, the controller 5 is not limited to performing the analysis processing by the autoencoder and may be configured to perform the analysis processing by an RNN (recurrent neural network) or an LSTM (long short-term memory). In a specific example, the already acquired pre-processing time-series data 51 (referred to as "past data") is processed by the RNN or the LSTM. Through this process, it is possible to acquire predicted time-series data if the measurement is performed right after. Then, if actually measured time-series data is acquired after the acquisition of the predicted time-series data, a waveform of the predicted time-series data is compared with a waveform of the actually measured time-series data. If a divergence in the signal waveforms is larger than a predetermined value, it can be determined abnormal. The above-described past data is data that does not contain the foreign matter signal and is acquired when the chemical solution is clean. Further, for example, if the (n+1)-th measurement (discharge of the resist and acquisition of the pre-processing time-series data 51) is being performed, the pre-processing time-series data 51 acquired in the measurement prior to the (n+1)-th measurement can be used as the above-described past data. That is, the predicted time-series data can be acquired from the pre-processing time-series data 51 acquired by the n-th, (n−1)-th, (n−2)-th, . . . measurements, and the predicted time-series data can be compared with the time-series data acquired by the (n+1)-th measurement.

In addition, the time-series data acquired before the current time during the (n+1)-th measurement is used as the past data, and the predicted time-series data for a time zone (referred to as A) after the current time during the (n+1)-th measurement is acquired. Then, the actually measured time-series data acquired in the time zone A may be compared with the predicted time-series data to determine the abnormality. That is, according to the RNN or the LSTM, it is possible to predict data to be acquired from the current time and determine the abnormality based on the predicted data. Further, as for a complicated process in which the length of the time zone during which the chemical solution is discharged at a regular rate or a flow rate changes with time according to a determined sequence or a process in which the discharge amount is changed by time factors, it is desirable to use these RNN and LSTM rather than the autoencoder method because it is possible to determine the abnormality with higher accuracy.

In the above-described exemplary embodiment, the forward scattering method is used. However, a lateral scattering method that receives laterally scattered light may be used. Also, instead of such a light scattering method in which the detection is performed by receiving the scattered light, the detection may be performed based on a light shielding method in which light to be radiated to the light receiving elements 40A and 40B is changed by blocking an optical path formed between the laser beam irradiator 41 and the light receiving elements 40A and 40B. As such, the detection method is not limited to a specific detection method.

The light receiving elements 40A and 40B only need to receive the light supplied from the flow path 16 (16A to 16K). Since the light scattering method and the light shielding method are included as detection methods as described above, the light supplied from the flow path 16 to the light receiving element group 40 includes the light irradiated from the laser beam irradiator 41 and passing through the flow path 16 and the light generated and supplied by the action of the polymers in the flow path 16. Further, the chemical solution containing polymers and used for forming the coating film is not limited to the resist. For example, the chemical solution may be a chemical solution for forming the antireflection film, and the abnormality in the state of the polymers of the chemical solution may be detected. Furthermore, in each of the above-described examples, during the detection of the abnormality, the controller 5 determines the abnormality by determining whether each acquired detection value falls within an allowable range. However, the detection of the abnormality may include the acquisition of the detection value only without performing the determination. Also, the above-described exemplary embodiments can be appropriately combined with each other or modified.

Figure 14:
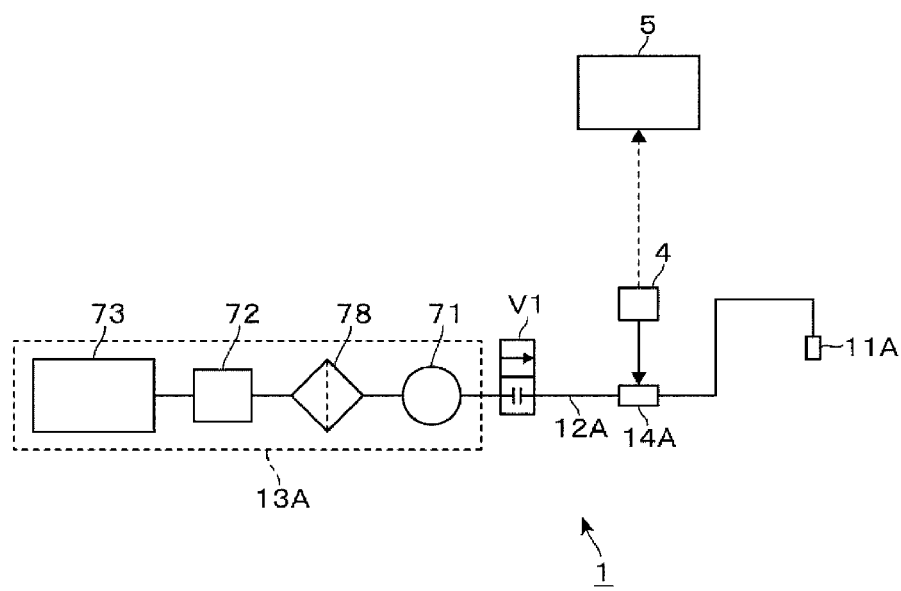
FIG. 14 is a schematic diagram of the resist coating device.

Although omitted in FIG. 10, a filter 78 configured to collect particles in the resist is provided, for example, between the pump 71 and the tank 72 in each of the chemical solution supply lines 12A to 12J. FIG. 14 representatively shows the filter 78 provided in the chemical solution supply line 12A. As a preparation before processing using the nozzle 11A, for example, the filter 78 of the chemical solution supply line 12A is cleaned and wetted by a thinner as the solvent forming the resist. Specifically, for example, the upstream side of the chemical solution supply line 12A is connected to a thinner source instead of the bottle 73 in which the resist is preserved, and the thinner is supplied from the thinner source toward the nozzle 11A to perform the cleaning and the wetting.

Thereafter, the chemical solution supply line 12A is connected to the bottle 73 instead of the thinner source, and the resist is supplied to the nozzle 11A by the pump 71. Accordingly, the thinner in the filter 78 and the chemical solution supply line 12A is purged to the nozzle 11A, and, thus, the thinner is gradually replaced with the resist in the filter 78 and the chemical solution supply line 12A. When the replacement is completed, the processing using the nozzle 11A can be performed. The controller 5 can detect the timing when this replacement is completed, i.e., the timing when the chemical solution supply line 12A is filled with a desired chemical solution.

A method of detecting the timing of the replacement completion will be specifically described. For example, when a replacement operation is started by force-feeding the resist to the nozzle 11A with the pump 71, the irradiation of light from the optical detection unit 4 to the cuvette 14A and the acquisition of the time-series data of the voltage signal, which has been described as the pre-processing time-series data 51, by the controller 5 are started. The controller 5 calculates the average value for each predetermined section, i.e., the moving average value, while acquiring the time-series data. As the above-described replacement proceeds, the polymers forming the resist flowing through the chemical solution supply line 12A increase and the time-series data of voltage signal changes, and, thus, the moving average value to be calculated changes. Each time the controller 5 calculates a new moving average value, the controller 5 compares the newly calculated moving average value with a reference value stored in advance in the memory of the controller 5.

As a result of the comparison between the moving average value and the reference value, if it is determined that the moving average value is different from the reference value, the supply of the resist to the nozzle 11A with the pump 71 is continued. If it is determined that the moving average value is equal to the reference value, which means the replacement in the filter 78 and the chemical solution supply line 12A is completed, i.e., the ratio of the resist to the thinner used for wetting the resist is 100%:0%, the discharge operation of the pump 71 is stopped and the replacement operation is ended. When the replacement operation is ended, the light irradiation to the cuvette 14A from the optical detection unit 4 is also stopped. The operation of the pump 71 and the light irradiation are stopped by, for example, the controller 5. By detecting the timing of the replacement completion, it is possible to suppress the waste of the resist. Therefore, it is possible to reduce the cost for operating the device.

As another method of detecting the timing of the replacement completion, there is a method of discharging the resist from the nozzle 11A to the wafer W to form the resist film and checking the film thickness of the resist film. When the detection based on the film thickness is performed, the film thickness is measured each time a predetermined amount of resist is supplied to the chemical solution supply line 12A and purged. Then, changes in the film thickness are checked to detect whether the replacement is completed. However, in order to check the film thickness as such, the wafer W needs to be transferred to a film thickness measuring device, and the formation of the resist film and the measurement of the film thickness by the film thickness measuring device are performed a plurality of times, which requires time and effort. However, by detecting the timing of the replacement completion based on the waveform of the time-series data as described above, it is not necessary to apply the resist to the wafer W. Therefore, the number of detections can be reduced to reduce the time and the effort, and the film thickness measuring device may not be needed. Further, the detection of whether the replacement of the chemical solution in the chemical solution flow path is completed as described above is performed to detect whether the chemical solution in the flow path becomes normal and thus can be included in the detection of the abnormality in the chemical solution.

In the above description, the moving average value is directly calculated from the acquired time-series data. However, as described above, the moving average value may be calculated from the time-series data acquired as a result of analysis of the time-series data. That is, for example, a processing may be performed by the autoencoder to calculate the moving average value from a periodic waveform acquired by excluding the abnormal waveform and it may be determined whether the replacement is completed based on the moving average value. As a result, the influence of the abnormal polymer is removed. Therefore, the timing of the replacement completion can be detected with higher accuracy.

Figure 15:
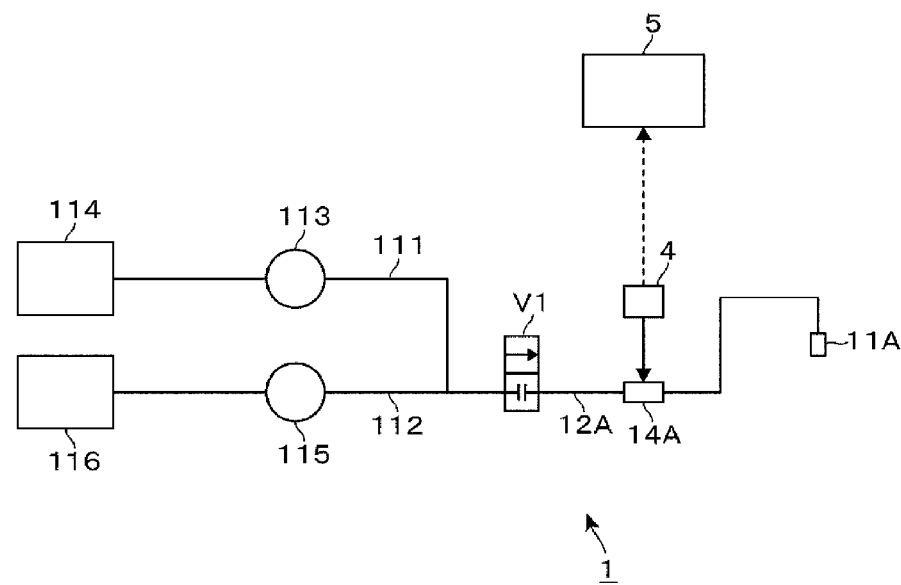
FIG. 15 is another schematic diagram of the resist coating device.

FIG. 15 shows a modification example of the resist coating device 1. In this modification example, the upstream side of the chemical solution supply line 12A is branched into two branch lines 111 and 112. The upstream side of the branch line 111 is connected to a bottle 114 via a pump 113, and the upstream side of the branch line 112 is connected to a bottle 116 via a pump 115. In the bottle 114, a resist having a relatively high viscosity is preserved, and in the bottle 116, a thinner is preserved. Further, the thinner preserved in the bottle 116 forms a solvent of the resist preserved in the bottle 114. The pumps 113 and 115 force-feed the resist and the thinner, respectively, to the nozzle 11A. Accordingly, the resist and the thinner are mixed while flowing through the chemical solution supply line 12A to be discharged from the nozzle 11A as a resist (mixed solution) having a predetermined viscosity.

The discharge amounts of the pumps 113 and 115 are set in advance. Therefore, the ratio, i.e., the mixing ratio, of the resist supplied from the bottle 114 to the thinner supplied from the bottle 116 in the mixed solution discharged from the nozzle 11A is expected to be a preset value. In this resist coating device 1, it is detected whether the actual mixing ratio is the set value based on the above-described pre-processing time-series data.

The solutions are discharged into the chemical solution supply line 12A by the pumps 113 and 115, respectively, to become a mixed solution, and while the mixed solution flows through the chemical solution supply line 12A, the light is irradiated to the cuvette 14A so that the above-described time-series data is acquired. Further, the average value of voltages for a predetermined time period is calculated from the time-series data, and it is determined whether the average value is equal to a reference value. The average value of the voltages changes depending on the ratio of the resist to the thinner due to the influence of the polymers forming the resist. If it is determined that the average value of the voltages is equal to the reference value, the mixing ratio is considered equal to a set value. If the average value of the voltages is not equal to the reference value, the mixing ratio is not considered equal to the set value, which means the abnormality occurs, and, thus, for example, the alarm is output. The above-described determination is performed by the controller 5. Further, even when it is determined whether the mixture ratio is suitable as described above, the time-series data that has been analyzed may be used as in the case where the timing of the replacement completion is detected.

Although the resist containing polymers and the thinner not containing polymers are used as the chemical solutions respectively supplied by the pumps 113 and 115, the chemical solutions respectively discharged from the pumps 113 and 115 may contain polymers. Even in that case, the ratio of the chemical solutions changes, and, thus, the waveform of the time-series data changes due to the influence of the polymers contained in each chemical solution. Therefore, it may be determined whether the mixing ratio of the chemical solutions is suitable based on the time-series data as described above. It is possible to determine whether the ratio is appropriate. Even when the replacement described above with reference to FIG. 14 is performed, each of the chemical solution before the replacement and the chemical solution after the replacement may contain polymers.

Herein, as described above, when it is detected whether the ratio between a first chemical solution and a second chemical solution (first chemical solution/second chemical solution) is a desired value, the difference in the signal intensity of the time-series data acquired from the first chemical solution and the second chemical solution may be small depending on the types of the first and second chemical solutions. Since the difference in the signal intensity is small, it may be difficult to detect whether the first chemical solution/the second chemical solution is a desired value just by acquiring the average value as described above. In that case, the controller 5 may store the average value of the signal intensities acquired from time-series data when the first chemical solution/the second chemical solution reaches a desired value and information on the period and amplitude of the waveform. Further, when the time-series data is acquired by the light irradiation, it is determined whether the average value of the signal intensities and the period and the amplitude of the waveform acquired from the time-series data are approximate to the previously stored average value of the signal intensities and the period and the amplitude of the waveform, respectively. Thus, it is only necessary to determine whether the first chemical solution/the second chemical solution is a desired value. It may be detected whether the first chemical solution/the second chemical solution is a desired value just by using the period and the amplitude of the waveform without using the average value of the signal intensities. Therefore, it is only necessary to acquire the ratio of the chemical solutions in the flow path based on the time-series data acquired from the optical detection unit 4, and the present disclosure is not limited to the calculation of the moving average value from the time-series data and the acquisition of the ratio of the chemical solutions based on the calculated moving average value. Even when detection is performed based on the amplitude and the wavelength as such, the above-described time-series data that has been analyzed may be used.

The ratio of the chemical solutions to be detected may be the ratio of three or more types of chemical solutions. Further, when the replacement completion of a chemical solution in a chemical solution flow path is detected, one of the chemical solutions before or after the replacement may be desirable to be a chemical solution in which no polymer is mixed like the thinner as in the above-described example. This is because the difference in the waveform between time-series data before the replacement completion and time-series data at the time of the replacement completion is relatively large, and, thus, the timing of the replacement completion can be detected more reliably. Further, even when the ratio of the chemical solutions in the mixed solution is detected, one of the chemical solutions forming the mixed solution may be desirable to be a chemical solution in which no polymer is mixed. This is because the difference between time-series data when the mixture ratio is normal and time-series data when the mixture ratio is abnormal can be relatively large, and, thus, the result of the detection is highly reliable. That is, when the ratio of the chemical solution containing polymers to another chemical solution in the chemical solution flow path is detected, the other chemical solution may contain polymers. However, more desirably, the other chemical solution may not contain polymers.

Further, as for the two types of chemical solutions before and after the replacement and the two types of chemical solutions mixed with each other, if the solvent is a common solvent like the resist and thinner described above, more uniform replacement and mixing can be performed, and, thus, detection data with high reliability can be acquired. Therefore, the timing of the replacement completion or the timing of reaching a specific mixing ratio can be more reliably determined in real time, which is desirable. It has been described that when the ratio between the chemical solutions is detected, one of the chemical solutions is a chemical solution containing polymers. However, the present technology can also be applied to a case where the one chemical solution is a liquid that does not polymers but contains, for example, a solvent and a solid or liquid material that is different from the solvent and is not a polymer. The exemplary embodiments disclosed herein are illustrative and do not limit the present disclosure. The above-described exemplary embodiments may be omitted, substituted, or changed in various forms without departing from the scope and spirit of the appended claims.

[Evaluation Test]

As described in FIG. 14, the chemical solution in the chemical solution supply line 12A is replaced between the resist and the thinner and the moving average value of the signal intensities is acquired from the time-series data acquired from the optical detection unit 4. However, unlike the processing described above with reference to FIG. 14, the thinner is supplied to the chemical solution supply line 12A in which the resist is already supplied to replace the resist with the thinner.

Figure 16:
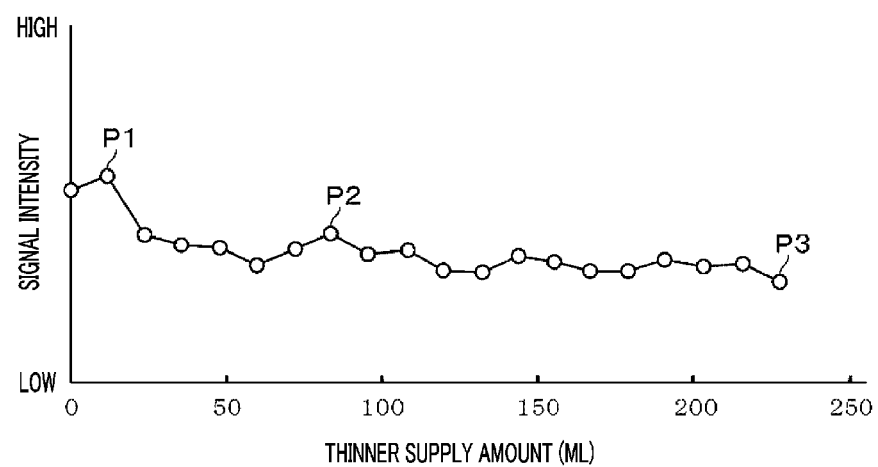
FIG. 16 is an explanatory diagram showing a result of an evaluation test.

The graph of FIG. 16 shows the result of the evaluation test. The horizontal axis of the graph indicates the supply amount (unit: mL) of the thinner supplied for purging the inside of the chemical solution supply line 12A. The longitudinal axis of the graph indicates the moving average value of the signal intensities, and the value is increased toward an upper side of the longitudinal axis. As indicated by the points plotted in the graph, the moving average value of the signal intensities is gradually decreased when the supply amount of the thinner is increased. Further, when 230 mL of the thinner is supplied, the moving average value is a value indicating that the thinner in the chemical solution supply line 12A reaches 100%.

Figure 17:
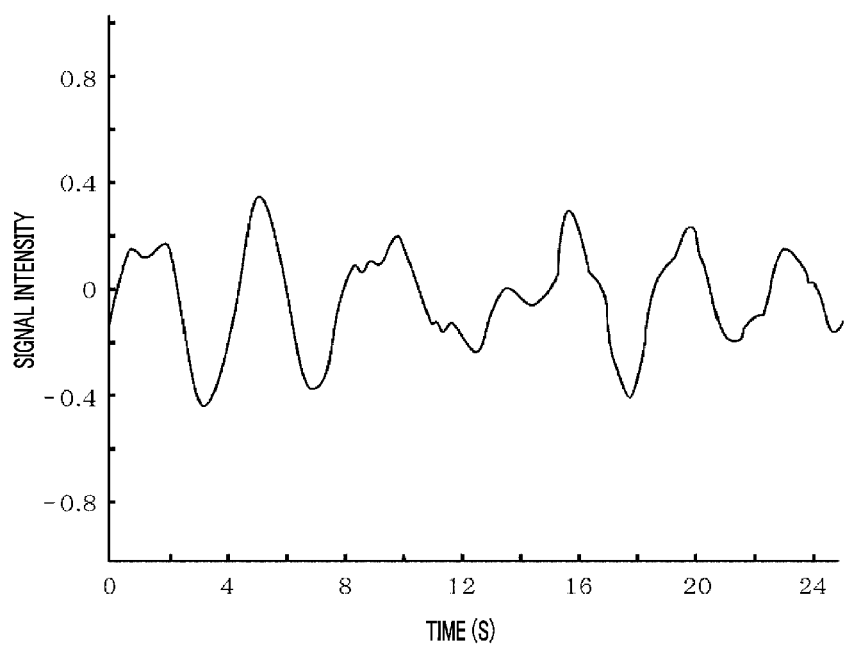
FIG. 17 is an explanatory diagram showing a result of the evaluation test.
Figure 18:
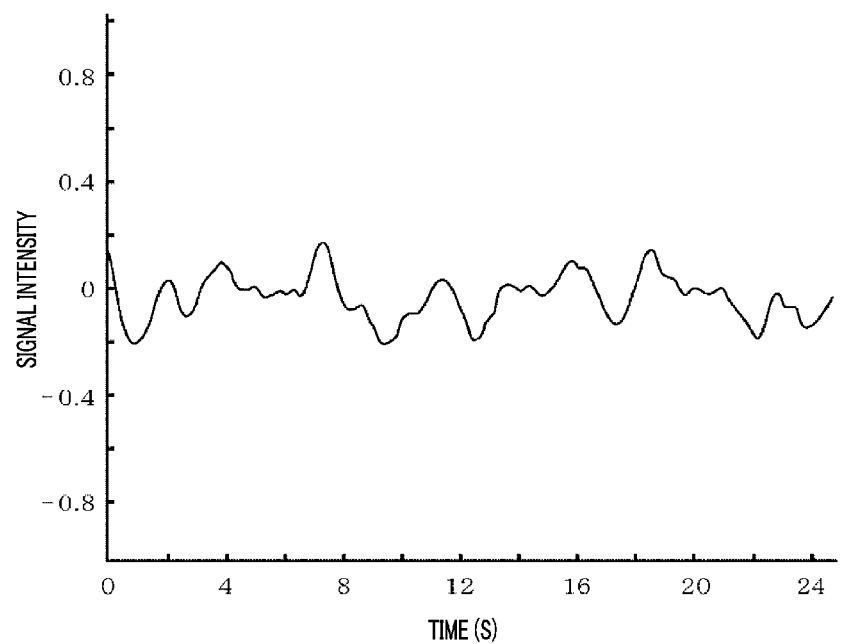
FIG. 18 is an explanatory diagram showing a result of the evaluation test.
Figure 19:
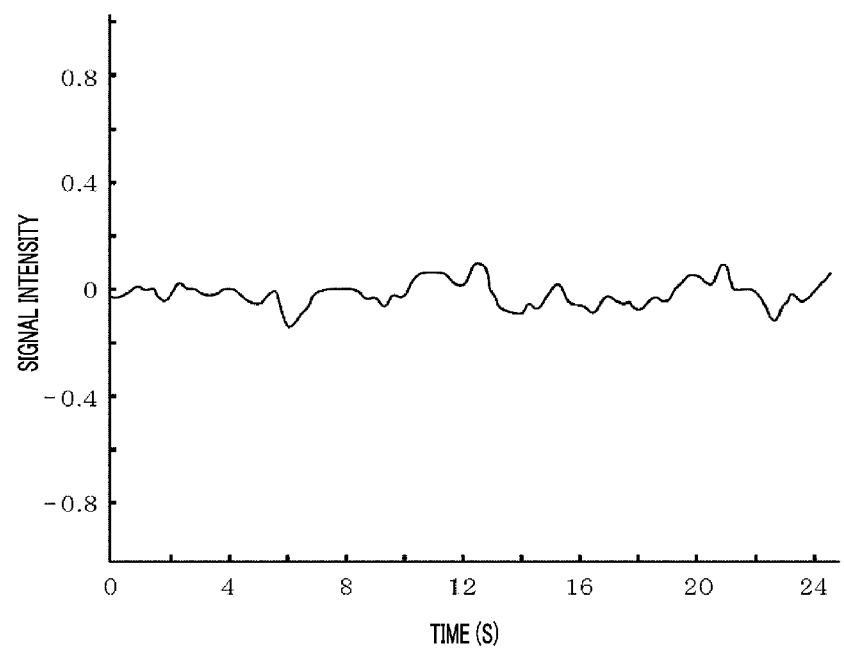
FIG. 19 is an explanatory diagram showing a result of the evaluation test.

Among the points plotted in the graph of FIG. 16, time-series data used for calculating points P1, P2 and P3 are shown in FIGS. 17, 18 and 19, respectively. The P1, P2 and P3 refer to points when the thinner is supplied in the amounts of 10 mL, 80 mL and 230 mL, respectively. In the graphs of FIGS. 17, 18 and 19, the horizontal axis indicates the elapsed time from a predetermined time point, and the longitudinal axis indicates the signal intensity. As is apparent from the graphs of FIGS. 17 to 19, the waveform of the acquired time-series data varies depending on the supply amount of the thinner. Due to the difference in the waveform, the moving average values of the points P1 to P3 are different from each other. Therefore, from the result of the evaluation test, it can be seen that the time-series data of the signal intensity changes depending on the ratio of the chemical solutions in the chemical solution flow path, and, thus, it can be assumed that the timing of the replacement completion can be detected based on the time-series data.

EXPLANATION OF CODES

According to the present disclosure, it is possible to suppress the occurrence of the abnormality in the processing of the target object with the chemical solution and detect whether the chemical solution containing the polymer is mixed with another chemical solution at the desired ratio in the chemical solution flow path.

We claim:

1. An abnormality detection device of a chemical solution, comprising:
    a chemical solution flow path in which a chemical solution containing polymers flows;
    a laser beam irradiator configured to irradiate a laser beam to the chemical solution flow path;
    a light receiving element configured to receive light supplied from the chemical solution flow path;
    a detector configured to detect, based on a signal output from the light receiving element, a ratio between a chemical solution containing the polymers and another chemical solution in the chemical solution flow path; and
    an analysis processing unit configured to perform an analysis processing on the ratio based on time-series data of signal intensity acquired from the signal outputted from the light receiving element by calculating an average value for each predetermined section while acquiring the time-series data, and comparing the new average value with a reference value at each time a new average value is calculated,
    wherein the detector is further configured to detect, based on the signal output from the light receiving element, an abnormality in a state of polymers corresponding to a majority of the polymers contained in the chemical solution,
    wherein the detecting of the abnormality in the state of the polymers includes detecting an abnormality of a particle diameter of the polymers based on a background signal for detecting a foreign matter of the chemical solution, and
    when a standard deviation of optical particle diameters of the polymers is σ, the majority of the polymers are polymers having optical particle diameters with deviations of ±3σ or less from an average value.

2. The abnormality detection device of the chemical solution of claim 1,
    wherein the detector detects the abnormality in the state of the polymers based on data subjected to the analysis processing.

3. The abnormality detection device of the chemical solution of claim 2,
    wherein the analysis processing unit includes an autoencoder to which the time-series data is input, a recurrent neural network or an LSTM.

4. The abnormality detection device of the chemical solution of claim 2,
    wherein the analysis processing unit performs a Fourier transform on the time-series data of the signal intensity.

5. A liquid processing device, comprising:
    an abnormality detection device of a chemical solution as claimed in claim 1;
    a reservoir configured to supply the chemical solution to the chemical solution flow path and preserve the chemical solution therein;
    a nozzle, connected to a downstream side of the chemical solution flow path, through which the chemical solution is supplied to a substrate as a target object; and
    a placing section on which the substrate is placed.

6. The liquid processing device of claim 5, further comprising:
    a handling mechanism configured to handle the abnormality in the state of the polymers when the abnormality is detected by the detector.

7. The liquid processing device of claim 6, further comprising:
    a branch path branched from a downstream side of a light irradiation region to be irradiated with the laser beam in the chemical solution flow path and configured to supply the chemical solution to a flow path different from the nozzle,
    wherein the handling mechanism includes a switching unit configured to switch a supply destination of the chemical solution passing through the light irradiation region from the nozzle to the branch path when the abnormality in the state of the polymers is detected.

8. The liquid processing device of claim 6,
    wherein the chemical solution is configured to form a coating film on the substrate,
    the abnormality in the state of the polymers includes an abnormality in a concentration of the polymers in the chemical solution, and
    the handling mechanism includes a thickness adjustment mechanism configured to adjust a thickness of the coating film on the substrate when the abnormality in the concentration of the polymers is detected.

9. The liquid processing device of claim 8,
wherein the thickness adjustment mechanism includes a substrate rotation mechanism configured to adjust an amount of the chemical solution to be removed from the substrate by adjusting a rotation number of the substrate.

10. The liquid processing device of claim 8,
wherein the thickness adjustment mechanism includes a supply amount adjustment mechanism configured to adjust a supply amount of the chemical solution to the substrate.

11. A substrate processing apparatus, comprising:
a liquid processing device as claimed in claim 5;
a heating module configured to heat the substrate on which a coating film is formed; and
a transfer mechanism configured to transfer the substrate from the liquid processing device to the heating module,
wherein the heating module heats the substrate at a temperature or for a time period depending on presence or absence of the detected abnormality.

12. An abnormality detection method of a chemical solution, comprising:
supplying a chemical solution containing polymers configured to form a coating film on a target object into a chemical solution flow path;
irradiating a laser beam to the chemical solution flow path by a laser beam irradiator;
outputting a signal from a light receiving element configured to receive light supplied from the chemical solution flow path; and
detecting, based on the signal output from the light receiving element, an abnormality in a state of polymers corresponding to a majority of the polymers contained in the chemical solution,
wherein the detecting of the abnormality in the state of the polymers includes detecting an abnormality of a particle diameter of the polymers based on a background signal for detecting a foreign matter of the chemical solution, and
when a standard deviation of optical particle diameters of the polymers is σ, the majority of the polymers are polymers having optical particle diameters with deviations of ±3σ or less from an average value.

13. The abnormality detection method of claim 12, further comprising:
detecting, based on the signal output from the light receiving element, a ratio between the chemical solution containing the polymers and another chemical solution in the chemical solution flow path; and
performing an analysis processing on the ratio based on time-series data of signal intensity acquired from the signal outputted from the light receiving element by calculating an average value for each predetermined section while acquiring the time-series data, and comparing the new average value with a reference value at each time a new average value is calculated.

14. A liquid processing method, comprising:
an abnormality detection method of a chemical solution as claimed in claim 13;
placing a substrate as the target object on a placing section;
supplying a chemical solution from a reservoir configured to preserve the chemical solution therein to the chemical solution flow path; and
supplying the chemical solution to the substrate from a nozzle connected to a downstream side of the chemical solution flow path.

15. The liquid processing method of claim 14,
wherein the chemical solution is configured to form the coating film on the substrate.

16. A substrate processing method, comprising:
a liquid processing method as claimed in claim 14;
transferring the substrate on which the coating film is formed to a heating module from the placing section; and
heating the substrate at a temperature or for a time period depending on presence or absence of the detected abnormality in the heating module,
wherein the chemical solution is configured to form the coating film on the substrate.

* * * * *